US010707099B2

(12) United States Patent
Breingan et al.

(10) Patent No.: US 10,707,099 B2
(45) Date of Patent: Jul. 7, 2020

(54) COLLECTION CHAMBER APPARATUS TO SEPARATE MULTIPLE FLUIDS DURING THE SEMICONDUCTOR WAFER PROCESSING CYCLE

(71) Applicant: VEECO INSTRUMENTS INC., Plainview, NY (US)

(72) Inventors: William Gilbert Breingan, Media, PA (US); Chris Hofmeister, Hampstead, NH (US); John Taddei, Jim Thorpe, PA (US)

(73) Assignee: VEECO INSTRUMENTS INC., Plainview, NY (US)

(*) Notice: Subject to any disclaimer, the term of this patent is extended or adjusted under 35 U.S.C. 154(b) by 356 days.

(21) Appl. No.: 15/496,755

(22) Filed: Apr. 25, 2017

(65) Prior Publication Data

US 2017/0294324 A1 Oct. 12, 2017

Related U.S. Application Data

(63) Continuation-in-part of application No. 14/457,645, filed on Aug. 12, 2014, now Pat. No. 9,768,041.
(Continued)

(51) Int. Cl.
*H01L 21/67* (2006.01)
*B01D 46/00* (2006.01)
(Continued)

(52) U.S. Cl.
CPC .... *H01L 21/67051* (2013.01); *B01D 46/0041* (2013.01); *B08B 3/14* (2013.01);
(Continued)

(58) Field of Classification Search
None
See application file for complete search history.

(56) References Cited

U.S. PATENT DOCUMENTS 4,903,717 A 2/1990 Sumnitsch
5,080,549 A 1/1992 Goodwin et al.
(Continued)

FOREIGN PATENT DOCUMENTS

JP 59-23517 2/1984
JP 63111960 7/1988
(Continued)

OTHER PUBLICATIONS

Kinoshita, Kei et al. "Stripping of High-Dose Ion-Implanted Photoresist Using a Combination of Dry and Wet Single-Wafer Processing" ECS Journal of Solid State Science and Technology, 2 (3) Q34-Q39 (2013) Published Dec. 31, 2012.

*Primary Examiner* — Cristi J Tate-Sims
(74) *Attorney, Agent, or Firm* — Leason Ellis LLP

(57) ABSTRACT

The wafer processing system includes a rotatable wafer support member for supporting a wafer and a plurality of collections trays disposed about a peripheral edge of the wafer support member. The collection trays are arranged in a stacked configuration, each collection tray having an inner wall portion and an outer wall portion that converge to define a trough section for collecting fluid. The system includes a chamber exhaust outlet that is formed in the housing for venting gas from the interior of the housing outside of the collection trays and a chemical exhaust outlet that is formed in the housing for venting gas that flows through the collection chamber to the chemical exhaust outlet. The chemical exhaust outlet is fluidly isolated from the chamber exhaust outlet.

23 Claims, 22 Drawing Sheets

Related U.S. Application Data

(60) Provisional application No. 61/864,895, filed on Aug. 12, 2013.

(51) Int. Cl.
- *B08B 3/14* (2006.01)
- *B08B 15/02* (2006.01)
- *H01L 21/687* (2006.01)

(52) U.S. Cl.
CPC .......... *B08B 15/02* (2013.01); *H01L 21/6708* (2013.01); *H01L 21/68735* (2013.01); *H01L 21/68764* (2013.01); *B01D 2279/35* (2013.01)

(56) References Cited

U.S. PATENT DOCUMENTS

| | | |
|---|---|---|
| 5,209,180 A | 5/1993 | Shoda et al. |
| 5,234,499 A | 8/1993 | Sasaki et al. |
| 5,421,595 A | 6/1995 | Cripe et al. |
| 5,492,566 A | 2/1996 | Sumnitsch |
| 5,513,668 A | 5/1996 | Sumnitsch |
| 5,725,663 A | 3/1998 | Parrette |
| 5,896,877 A | 4/1999 | Pirker |
| 5,967,578 A | 10/1999 | Frey |
| 5,979,475 A | 11/1999 | Satoh et al. |
| 5,997,653 A | 12/1999 | Yamasaka |
| 6,056,825 A | 5/2000 | Sumnitsch |
| 6,242,364 B1 | 6/2001 | Gurer et al. |
| 6,273,104 B1 | 8/2001 | Shinbara et al. |
| 6,328,846 B1 | 12/2001 | Langen et al. |
| 6,435,200 B1 | 8/2002 | Langen |
| 6,589,338 B1 * | 7/2003 | Nakamori ......... H01L 21/67051 118/50 |
| 6,669,808 B2 | 12/2003 | Adachi et al. |
| 6,793,769 B2 | 9/2004 | Kajino et al. |
| 6,807,974 B2 | 10/2004 | Ono et al. |
| 6,810,888 B2 | 11/2004 | Tsuchiya et al. |
| 6,858,092 B2 | 2/2005 | Langen |
| 7,007,702 B2 | 3/2006 | Langen |
| 7,122,084 B2 | 10/2006 | Hohenwarter |
| 7,172,674 B2 | 2/2007 | Engesser |
| 7,267,129 B2 | 9/2007 | Langen |
| 7,467,635 B2 | 12/2008 | Satoshi et al. |
| 7,584,760 B2 | 9/2009 | Miya |
| 7,608,152 B2 | 10/2009 | Miya et al. |
| 7,681,581 B2 | 3/2010 | Rose |
| 7,722,736 B2 | 5/2010 | Miya |
| 7,726,323 B2 | 6/2010 | Langen |
| 7,726,362 B2 | 6/2010 | Demers et al. |
| 7,799,695 B2 | 9/2010 | Engesser |
| 7,958,898 B2 | 6/2011 | Yoshida |
| 7,988,818 B2 | 8/2011 | Engesser |
| 8,075,731 B2 | 12/2011 | Miya |
| 8,109,282 B2 | 2/2012 | Miya et al. |
| 8,118,945 B2 | 2/2012 | Eitoku |
| 8,361,234 B2 | 1/2013 | Izuta et al. |
| 8,485,204 B2 | 7/2013 | Obweger |
| 8,501,025 B2 | 8/2013 | Hashizume et al. |
| 8,544,483 B2 | 10/2013 | Collins et al. |
| 8,596,623 B2 | 12/2013 | Frank et al. |
| 8,608,146 B2 | 12/2013 | Brugger et al. |
| 8,656,936 B2 | 2/2014 | Collins et al. |
| 8,684,015 B2 | 4/2014 | Lauerhaas et al. |
| 8,696,825 B2 | 4/2014 | Miya et al. |
| 8,721,834 B2 | 5/2014 | Koo et al. |
| 8,845,815 B2 | 9/2014 | Ogata |
| 8,888,952 B2 | 11/2014 | Gigacher et al. |
| 8,899,246 B2 | 12/2014 | Plazonic |
| 8,899,248 B2 | 12/2014 | Collins et al. |
| 8,926,788 B2 | 1/2015 | Hohenwarter |
| 8,955,529 B2 | 2/2015 | Hohenwarter |
| 9,093,482 B2 | 7/2015 | Brugger et al. |
| 9,136,155 B2 | 9/2015 | Kinoshita et al. |
| 9,305,770 B2 | 4/2016 | Kinoshita et al. |
| 9,362,147 B2 | 6/2016 | Izuta et al. |
| 9,364,873 B2 | 6/2016 | Hinode et al. |
| 9,431,276 B2 | 8/2016 | Miya et al. |
| 9,555,437 B2 | 1/2017 | Nakai et al. |
| 2001/0013684 A1 | 8/2001 | Smedt et al. |
| 2003/0170988 A1 | 9/2003 | Izumi et al. |
| 2003/0194878 A1 | 10/2003 | Miya |
| 2004/0040177 A1 | 3/2004 | Izumi et al. |
| 2004/0040584 A1 | 3/2004 | Miya et al. |
| 2004/0050491 A1 | 3/2004 | Miya et al. |
| 2004/0226655 A1 | 11/2004 | Kajino et al. |
| 2005/0021636 A1 | 1/2005 | Kumar |
| 2005/0199503 A1 | 9/2005 | Woodruff |
| 2005/0244579 A1 | 11/2005 | Matsuzawa et al. |
| 2005/0274400 A1 | 12/2005 | Chan |
| 2005/0276921 A1 | 12/2005 | Miya et al. |
| 2006/0021636 A1 | 2/2006 | Miya |
| 2006/0102289 A1 | 5/2006 | Fukatsu et al. |
| 2007/0175500 A1 | 8/2007 | Hohenwarter |
| 2007/0212884 A1 | 9/2007 | Yamamoto |
| 2008/0053493 A1 | 3/2008 | Kimura |
| 2008/0078426 A1 | 4/2008 | Miya et al. |
| 2008/0078428 A1 | 4/2008 | Yoshida |
| 2008/0121251 A1 | 5/2008 | Miya et al. |
| 2008/0142051 A1 | 6/2008 | Hashizume |
| 2008/0254224 A1 | 10/2008 | Kishimoto et al. |
| 2009/0050175 A1 | 2/2009 | Tanaka et al. |
| 2009/0090391 A1 | 4/2009 | Edamoto |
| 2010/0101497 A1 | 4/2010 | Izuta et al. |
| 2011/0290283 A1 | 12/2011 | Obweger et al. |
| 2012/0067847 A1 | 3/2012 | Sakurai |
| 2012/0186275 A1 | 7/2012 | Kato et al. |
| 2012/0223054 A1 | 9/2012 | Azuma et al. |
| 2013/0255718 A1 | 10/2013 | Takahashi |
| 2013/0256273 A1 | 10/2013 | Miura et al. |
| 2013/0291905 A1 | 11/2013 | Hashizume et al. |
| 2013/0327365 A1 | 12/2013 | Sato |
| 2013/0333722 A1 | 12/2013 | Tanaka |
| 2014/0041803 A1 | 2/2014 | Koshizawa et al. |
| 2014/0060573 A1 | 3/2014 | Yoshida |
| 2014/0090669 A1 | 4/2014 | Hinode et al. |
| 2014/0127908 A1 | 5/2014 | Okutani |
| 2014/0137902 A1 | 5/2014 | Aiura et al. |
| 2014/0174483 A1 | 6/2014 | Miya et al. |
| 2014/0202989 A1 | 7/2014 | Kishimoto et al. |
| 2014/0227884 A1 | 8/2014 | Engesser et al. |
| 2014/0261162 A1 | 9/2014 | Yamaguchi |
| 2014/0331927 A1 | 11/2014 | Nakano et al. |
| 2015/0001202 A1 | 1/2015 | Crabb et al. |
| 2015/0013732 A1 | 1/2015 | Negoro et al. |
| 2015/0020850 A1 | 1/2015 | Kato et al. |
| 2015/0020852 A1 | 1/2015 | Kato et al. |
| 2015/0040952 A1 | 2/2015 | Regan et al. |
| 2015/0047677 A1 | 2/2015 | Muramoto |
| 2015/0060407 A1 | 3/2015 | Negoro et al. |
| 2015/0072078 A1 | 3/2015 | Negoro et al. |
| 2015/0075569 A1 | 3/2015 | Collins et al. |
| 2015/0075571 A1 | 3/2015 | Miura |
| 2015/0090301 A1 | 4/2015 | Higuchi et al. |
| 2015/0114561 A1 | 4/2015 | Higashijima et al. |
| 2015/0187629 A1 | 7/2015 | Obweger et al. |
| 2015/0200087 A1 | 7/2015 | Kobayashi |
| 2015/0234296 A1 * | 8/2015 | Yagi ................. H01L 21/67063 355/72 |
| 2015/0243543 A1 | 8/2015 | Schwarzenbacher et al. |
| 2015/0262848 A1 | 9/2015 | Sano et al. |
| 2015/0340251 A1 | 11/2015 | Wakita et al. |
| 2016/0016206 A1 | 1/2016 | Osada et al. |
| 2016/0045938 A1 | 2/2016 | Aomatsu et al. |
| 2016/0059274 A1 | 3/2016 | Miya et al. |
| 2016/0093503 A1 * | 3/2016 | Tokuri ............. H01L 21/67051 438/745 |
| 2016/0111302 A1 | 4/2016 | Kahlon et al. |
| 2016/0126148 A1 | 5/2016 | Mauer et al. |
| 2016/0300727 A1 | 10/2016 | Hinode et al. |
| 2016/0351421 A1 | 12/2016 | Iwao et al. |
| 2017/0043379 A1 | 2/2017 | Sasaki et al. |
| 2017/0056936 A1 | 3/2017 | Nishiyama |

(56) References Cited

U.S. PATENT DOCUMENTS

2017/0069512 A1     3/2017  Yoshida
2017/0117135 A1*    4/2017  Yoshida ............ H01L 21/67028
2017/0294324 A1    10/2017  Breingan et al.

FOREIGN PATENT DOCUMENTS

| JP | 4-34902 | 8/1992 |
|----|---------|--------|
| JP | 9-181026 | 7/1997 |
| JP | 11-87294 | 3/1999 |
| JP | 3088118 | 9/2000 |
| JP | 3555724 | 8/2004 |
| JP | 2004-265910 | 9/2004 |
| JP | 5155035 | 2/2013 |
| JP | 5421610 | 2/2014 |
| JP | 2015-070157 | 4/2015 |
| KR | 20160090733 | 8/2016 |
| SG | 98382 | 9/2003 |
| SG | 118063 | 1/2006 |
| TW | 548690 | 8/2003 |

\* cited by examiner

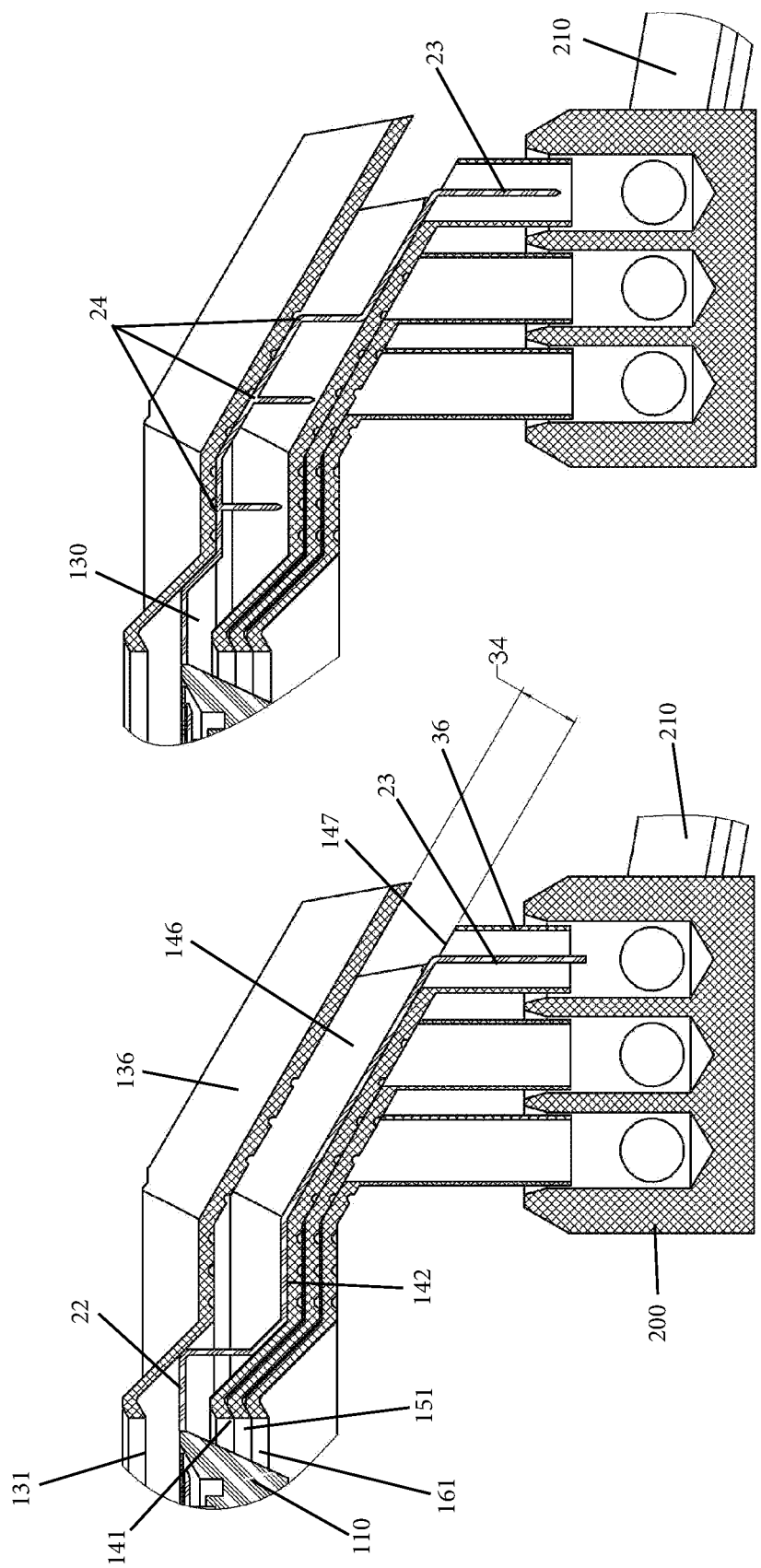

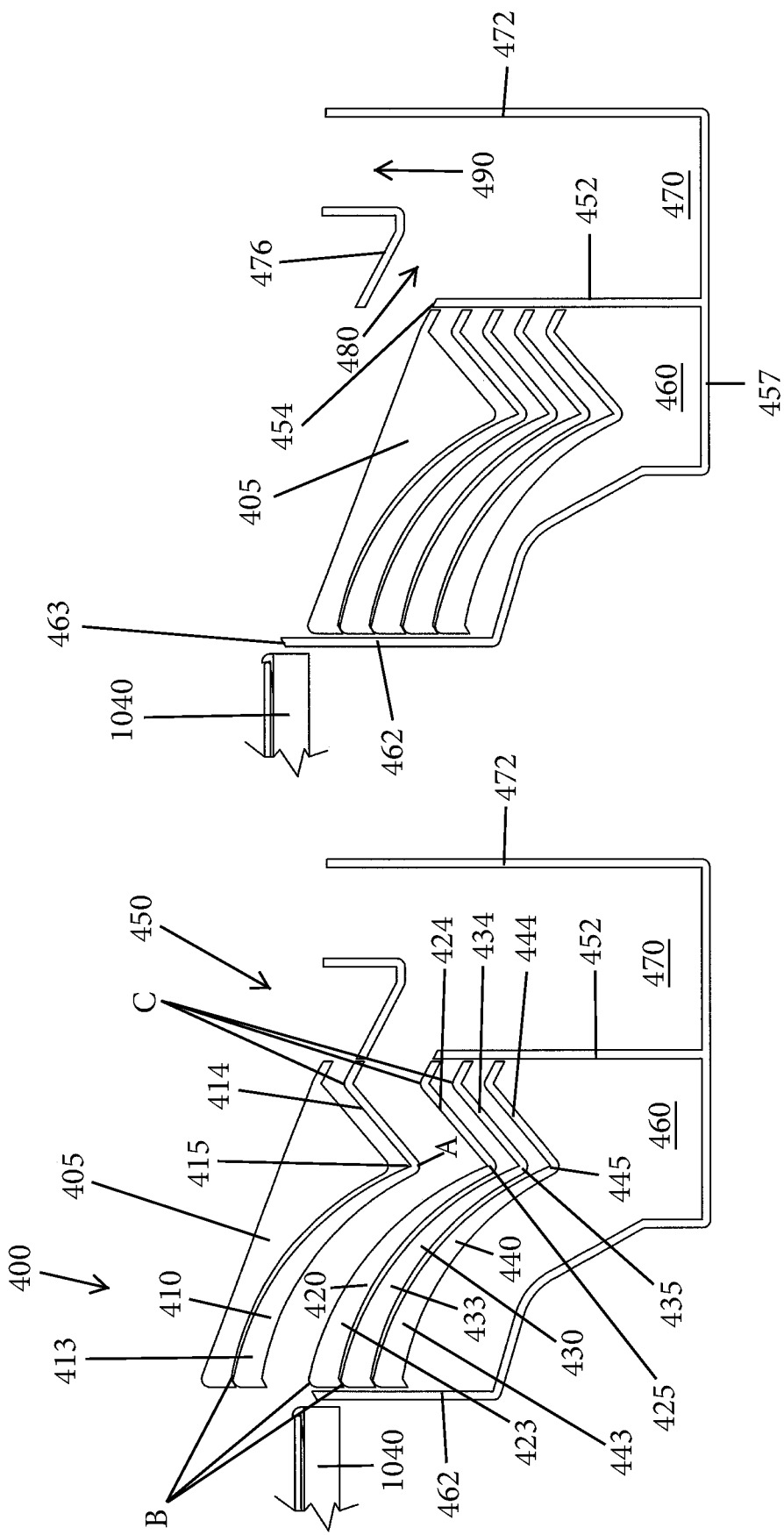

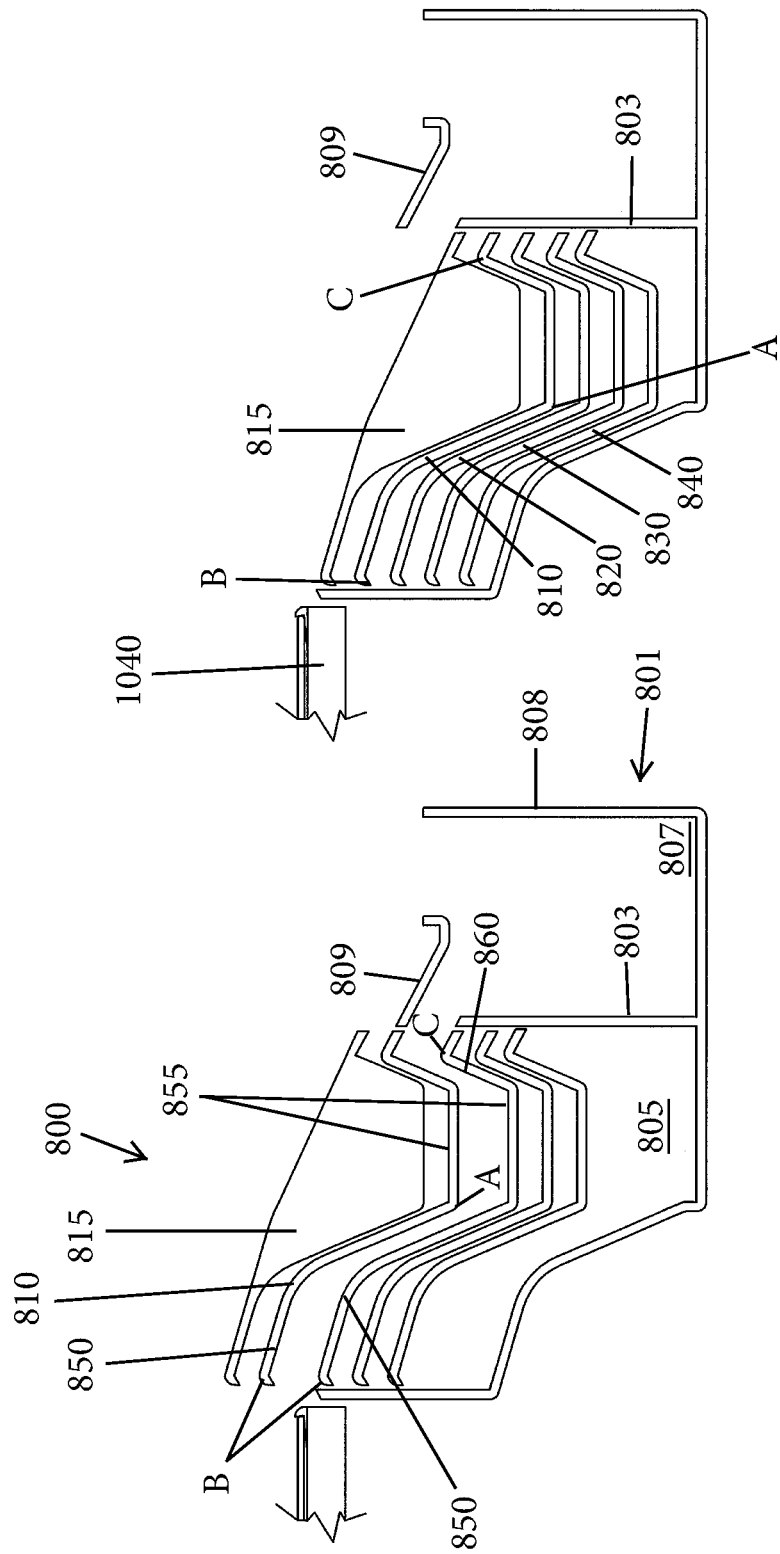

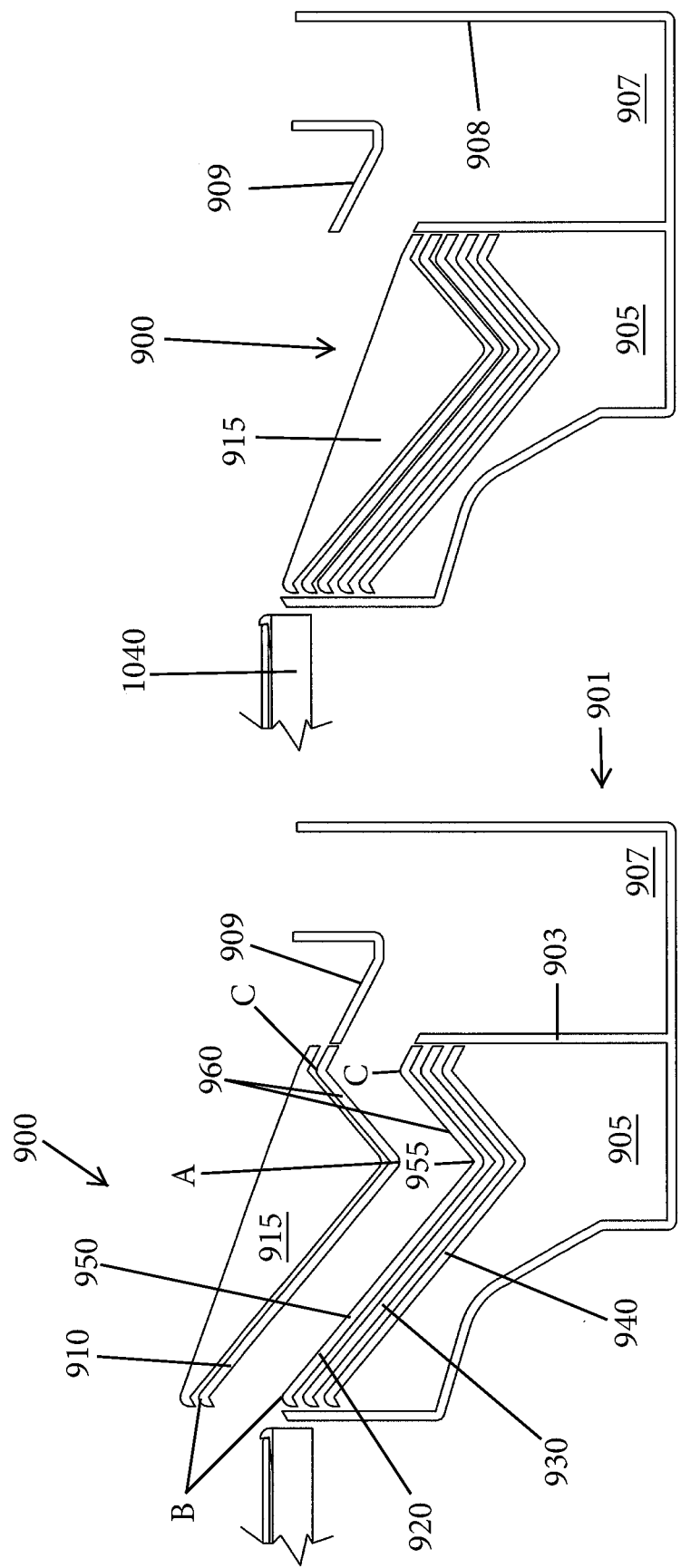

COLLECTION CHAMBER APPARATUS TO SEPARATE MULTIPLE FLUIDS DURING THE SEMICONDUCTOR WAFER PROCESSING CYCLE

CROSS-REFERENCE TO RELATED APPLICATIONS

The present invention is a continuation-in-part of U.S. patent application Ser. No. 14/457,645, filed Aug. 12, 2014, which claims the benefit of U.S. patent application Ser. No. 61/864,895, filed Aug. 12, 2013, each of which is hereby incorporated by reference in its entirety.

TECHNICAL FIELD

The present invention is generally directed to wafer processing equipment and more particularly, to a collection chamber apparatus that provides a means to separate and collect multiple different fluids for reuse during wafer processing.

BACKGROUND

This invention relates particularly to silicon wafer processing where multiple fluids are used during a process to clean, etch or do other wet process operations. The fluids are often expensive and it is desirable to reuse them to exhaustion.

Normal wafer processing employs one collection chamber to separate a special fluid from the waste drain and enable recirculation of the fluid.

The object of this invention is to have multiple, independent collection chambers, with the ability to separate multiple different fluids for recirculation and reuse.

SUMMARY

A wafer processing system includes a chamber housing. The system also includes a rotatable wafer support member for supporting a wafer and a plurality of independently movable collection trays disposed about the peripheral edge of the wafer support member. The collection trays are arranged in a stacked configuration, with each collection tray having a collection section for collecting fluid. At least one of the collection trays has a drain outlet in communication with the collection section for draining collected fluid.

A drive mechanism is provided for selectively and independently moving one or more of the collection trays to a raised position above the wafer support member so as to define a collection chamber formed between at least one raised collection tray and a lowered collection tray. The collection chamber is configured to collect fluid that is discharged from the wafer during the processing thereof and routes the collected fluid through the drain outlet of the lowered collection tray.

The system includes a chamber exhaust outlet that is formed in the housing for venting gas from the interior of the housing outside of the collection trays and a chemical exhaust outlet that is formed in the housing for venting gas that flows through the collection chamber to the chemical exhaust outlet. The chemical exhaust outlet is fluidly isolated from the chamber exhaust outlet.

According to another aspect of the present invention, a collection chamber apparatus (fluid collecting device) is composed of multiple (n+1) round collection trays which stack and seal into each other when not in use and form multiple (n) unique collection chambers and drain systems, as required.

In accordance with one embodiment, a wafer processing system including a fluid collection apparatus is configured to separate and collect multiple fluids for reuse during wafer processing. The wafer processing system includes a rotatable wafer support member for supporting a wafer and a plurality of collections trays disposed about a peripheral edge of the wafer support member. The collection trays are arranged in a stacked configuration, each collection tray having an inner wall portion and an outer wall portion that converge to define a trough section for collecting fluid. The inner wall portion is closer to the wafer support member than the outer wall portion. At least some of the collection trays have an outlet in fluid communication with the trough section for discharging the collected fluid, wherein a bottom edge (A) of the trough section defines a bottommost point of the collection tray, the inner wall portion has a top edge (B) and the outer wall portion has a top edge (C).

A drive mechanism is provided for selectively moving one or more of the collection trays to an elevated position above the wafer support member so as to define a collection chamber formed between a raised collection tray and a lowered collection tray. The collection chamber is configured to collect fluid that is discharged from the wafer during the processing thereof and routes the collected fluid through the outlet of the lowered collection tray.

To eliminate or greatly reduce any splash out of fluid being expelled into the collection chamber, the bottom edge (A) of the raised collection tray lies below the top edge (B) of the inner wall portion of the lowered collection tray and the bottom edge (A) of the raised collection tray is at a height that is equal to or below the top edge (C) of the outer wall portion.

BRIEF DESCRIPTION OF THE DRAWING FIGURES

FIG. 3B shows a cross-section through a drain of the collection chamber in the same position as FIG. 3A, with a defined fluid path being delineated;

FIG. 3C is same cross-section as FIG. 3A, showing an alternate fluid path and multiple underside drip grooves for routing fluid;

FIG. 14A is a cross-sectional view of a portion of a collection chamber apparatus defined by a plurality of collection trays in accordance with another embodiment of the present invention showing an upper cover and a first collection tray in a raised position (a first fluid collection position);

FIG. 14B is a cross-sectional view of the upper cover and collection trays of FIG. 14A in a closed position (lowered position);

FIG. 18A is a cross-sectional view of a portion of a collection chamber apparatus defined by a plurality of collection trays in accordance with another embodiment of the present invention showing an upper cover and a first collection tray in a raised position (a first fluid collection position);

FIG. 18B is a cross-sectional view of the upper cover and collection trays of FIG. 18A in a closed position (lowered position);

FIG. 19A is a cross-sectional view of a portion of a collection chamber apparatus defined by a plurality of collection trays in accordance with another embodiment of the present invention showing an upper cover and a first collection tray in a raised position (a first fluid collection position);

FIG. 19B is a cross-sectional view of the upper cover and collection trays of FIG. 19A in a closed position (lowered position)

DETAILED DESCRIPTION OF CERTAIN EMBODIMENTS

Figure 1:
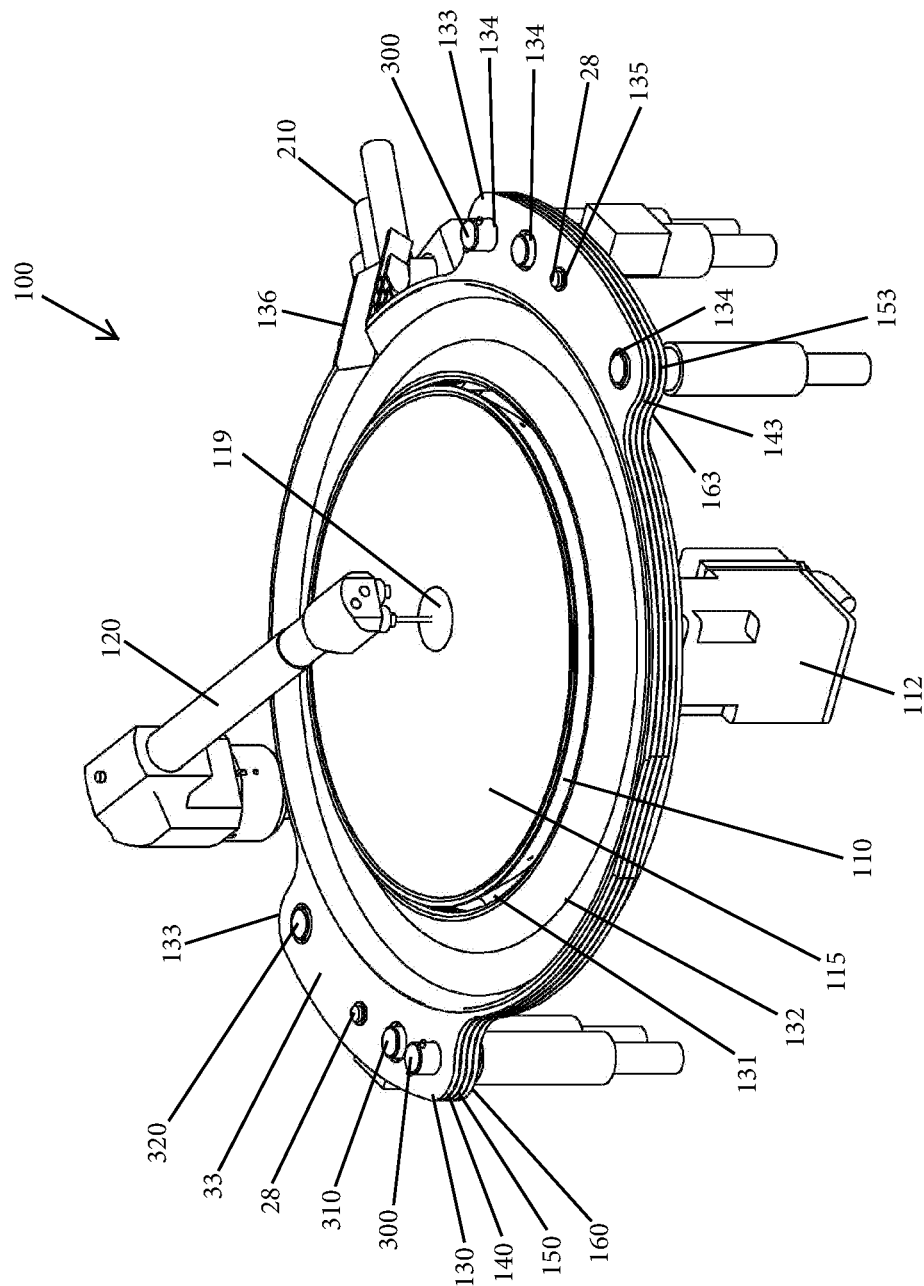
FIG. 1 is an isometric overview of a collection chamber apparatus in accordance with the present invention.
Figure 2A:
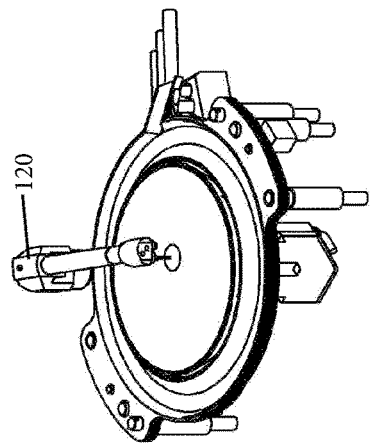
FIG. 2A is a perspective view showing four collection trays of the apparatus in a stacked, load wafer position.
Figure 2E:
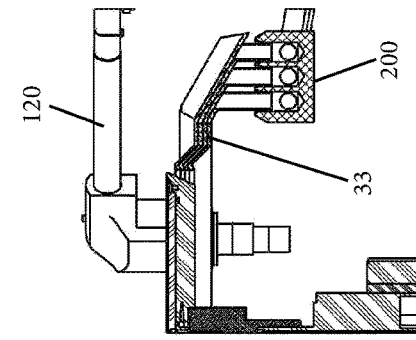
FIG. 2E is a cross-sectional view taken along the line B-B of FIG. 2B.
Figure 2B:
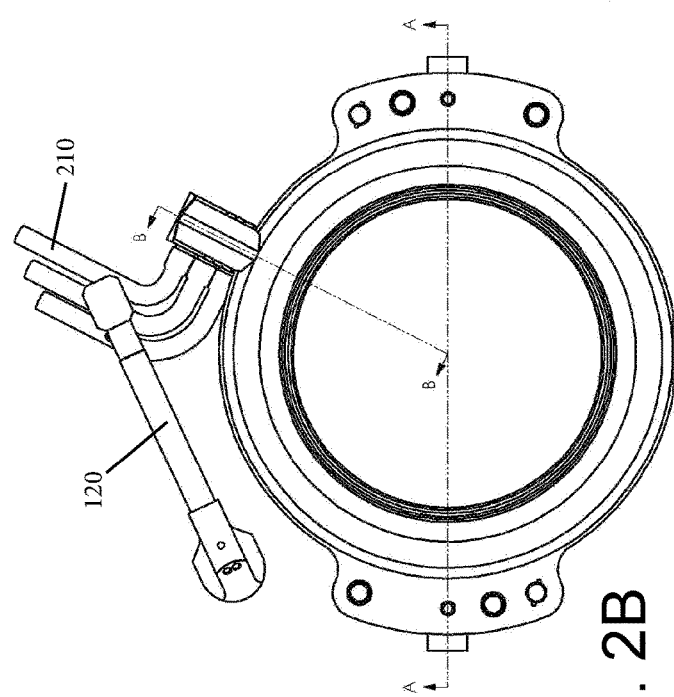
FIG. 2B is a top plan view of the apparatus.
Figure 2D:
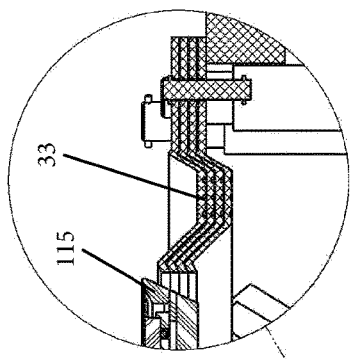
FIG. 2D is an enlarged cross-section of a portion of the stacked collection trays shown in FIG. 2C.
Figure 2C:
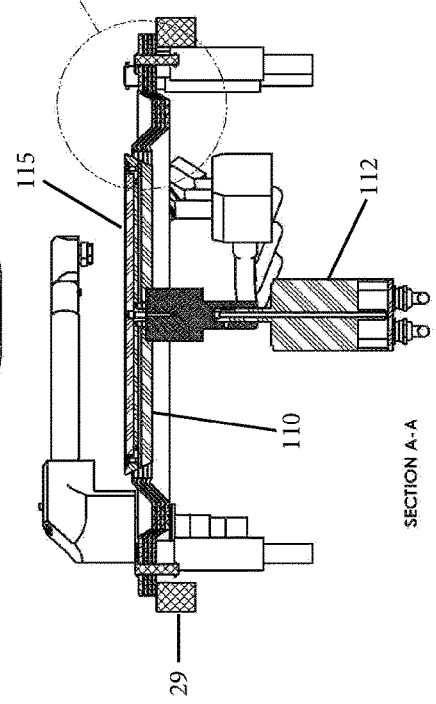
FIG. 2C is a cross-sectional view taken along the line A-A of FIG. 2B.

FIG. 1 is an overview of a collection chamber apparatus 100 of the present invention showing collection trays 130, 140, 150, 160 in a stacked, load wafer position 33 (see FIGS. 2 and 2A for additional clarity), in which a wafer 115 can be added or removed. The four trays surround the wafer 115. It will be understood that the proceeding discussion is merely exemplary of one implementation of the present invention and not limiting of the scope of the present invention since other implementations, as discussed below, are possible. As discussed herein, by creating discrete collection chambers that can be sealed with respect to one another, any spray from different processing chemicals can be collected in different chambers. For example, collection chamber 1 is provided for collection of a first chemical; collection chamber 2 is provided for collection of a second chemical, etc. Since each collection chamber is sealed from the others, cross-contamination of the chemicals is avoided.

Figure 6:
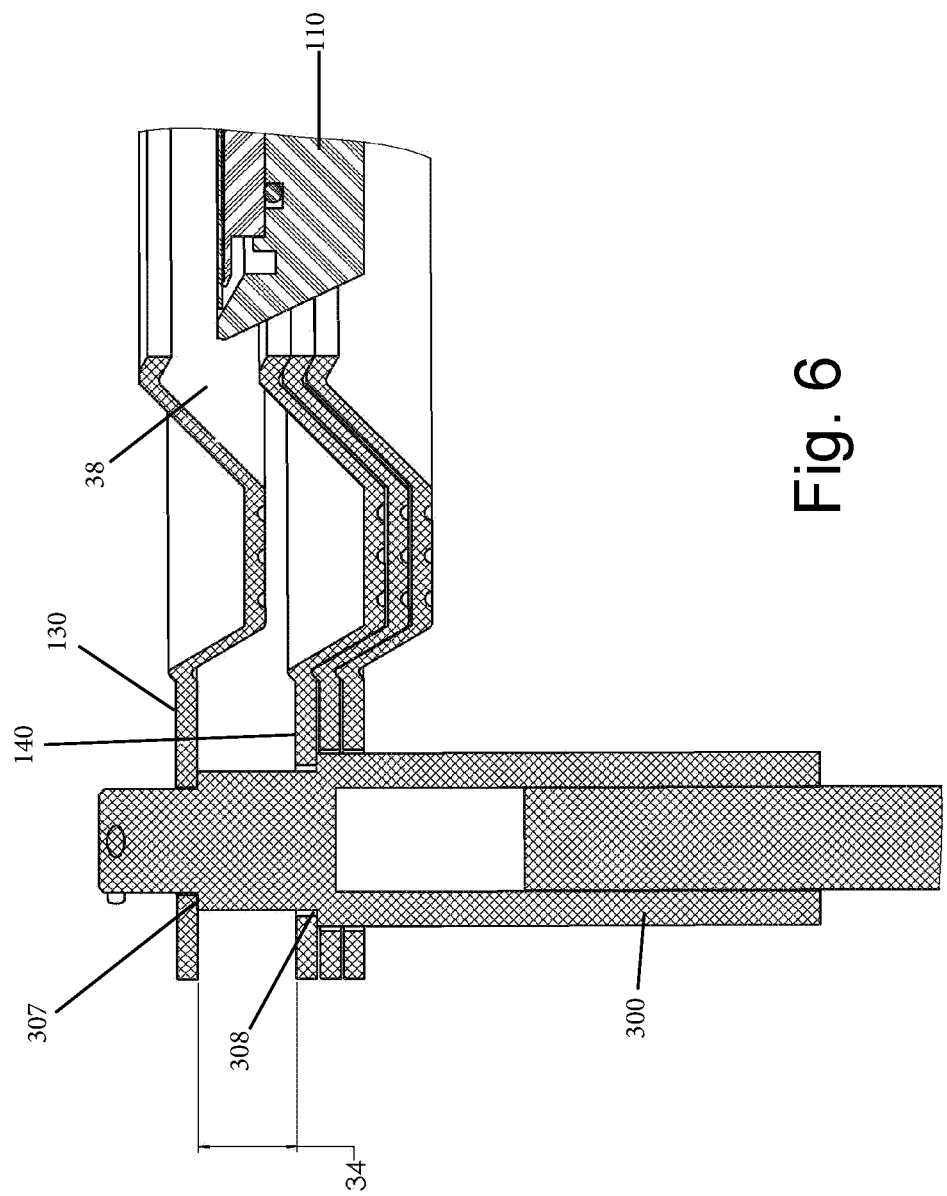
FIG. 6 shows a cross-section through air cylinder and the collection trays depicting how one air cylinder lifts two trays into a predetermined position and provides the correct chamber gap that defines the collection chamber space.

A first fluid separating position will follow as an example of the typical description of operation, for each of the three fluids. Referring to FIGS. 3 and 6 and according to one mode of operation, a pair of pistons 300 (e.g., air cylinders) (a drive mechanism) lift the collection trays 130, 140 forming a first collection chamber identified by the legend 34 (i.e., the gap (distance) between the plates). FIG. 6 shows in more detail the unique piston design which both lifts trays 130, 140 into vertical level 38, and forms the desired collection chamber gap 34 by way of shoulders 307 and 308. In particular, when the pistons 300 are actuated, a first region thereof passes through all of the aligned openings 134, 144, 154, 164 formed in the collection trays; a second region thereof passes only through the openings 144, 154, 164 and a third region thereof only passes through the openings 154, 164. When the pistons 300 complete their extended stroke, the underside of the collection tray 130 seats on shoulder 307 and the underside of the collection tray 140 seats on shoulder 308. The gap 34 (collection chamber) can be controlled and defined by the distance between the shoulders 307, 308 and the thickness of the trays and further, as discussed below, the gap distance can be controlled and defined by pin 28

Next, referring back to FIG. 3A, a motor 112 rotates a wafer 115 located on the spin chuck 110, a dispense arm 120 then centers over the wafer 115 and dispenses the first fluid in the process. The motor 112 increases RPM's to spread fluid over the wafers surface, excess fluid 22 is slung by centrifugal force off the peripheral edge of the spin chuck 110 and onto the underside of the slopped wall of tray 130, refer to FIG. 3B. Per fluid path 22, gravity drops the fluid into the collection tray 140 (e.g., into the collection track thereof), where it flows into the outlet port 146 and the fluid conduit member 147 and finally into a manifold 200. From there the fluid flows into the drain tube 210 and ends up in a discrete tank (not shown) for storage and reuse, where it is dispensed during the next wafer cycle.

FIG. 3C shows an alternate fluid path 30, in which the fluid 23 can run down the underside of tray 130 and multiple drip grooves 24 are included to stop the flow and direct the fluid down into the intended collection tray 140 (which is disposed below tray 130).

Figure 3A:
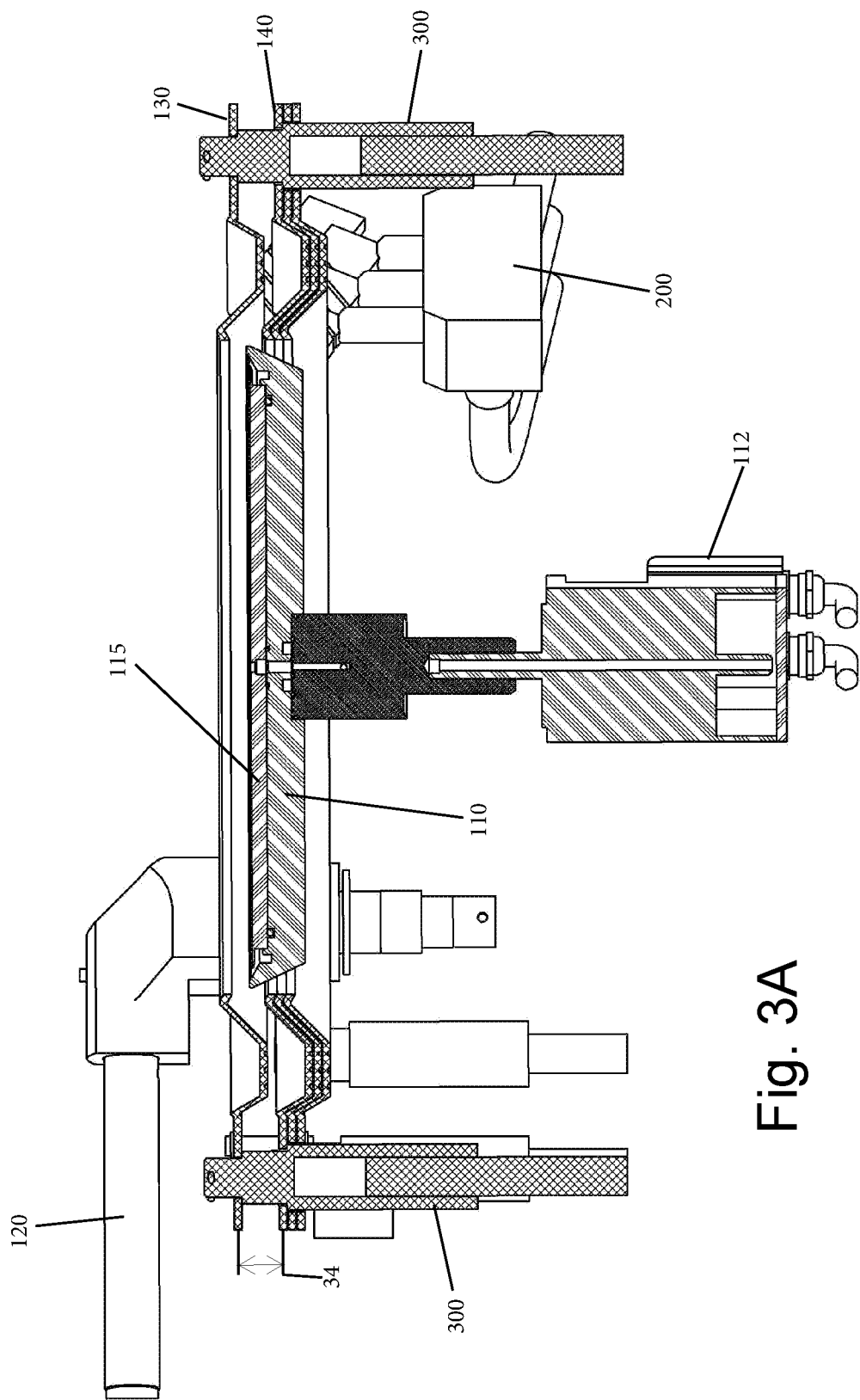
FIG. 3A is a cross-sectional view through the apparatus, with the collection chamber being in a first fluid collection position.
Figure 3D:
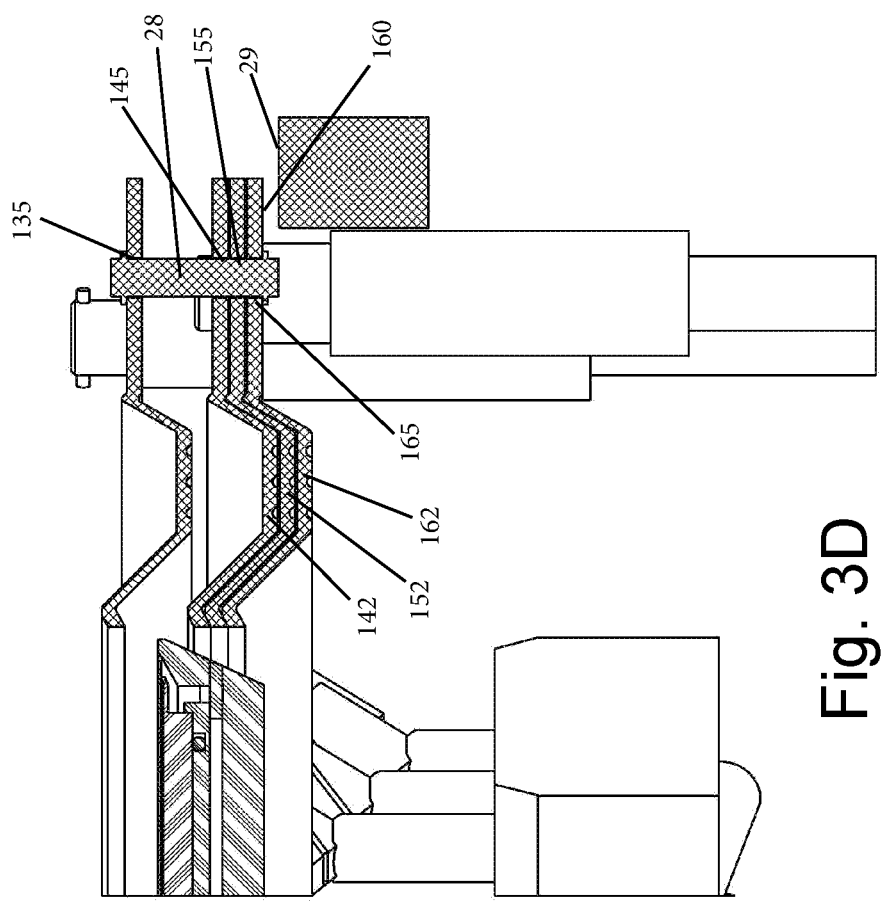
FIG. 3D is a cross-section showing a lift pin that constrains movement of the collection trays and a rest on which the collection tray seats.

FIG. 3D shows a cross-section through a lift pin 28. A pair of pins 28 extends through openings 135, 145, 155, 165 of the opposing flange sections of the collection trays. The pins 28 are configured to lift the bottom tray(s) 150, 160 off of a rest 29 and against the collection tray 140 to seal them against splashes, while still maintaining the chamber gap 34. The pins 28 are thus designed to hold the bottommost collection tray in contact with the others so as to provide a seal between the collection trays that are in contact with one another. As shown, the pin 28 includes a radial protrusion or the like at or near the bottom end (and also at or near the top end) which supports the bottommost tray.

Figure 4:
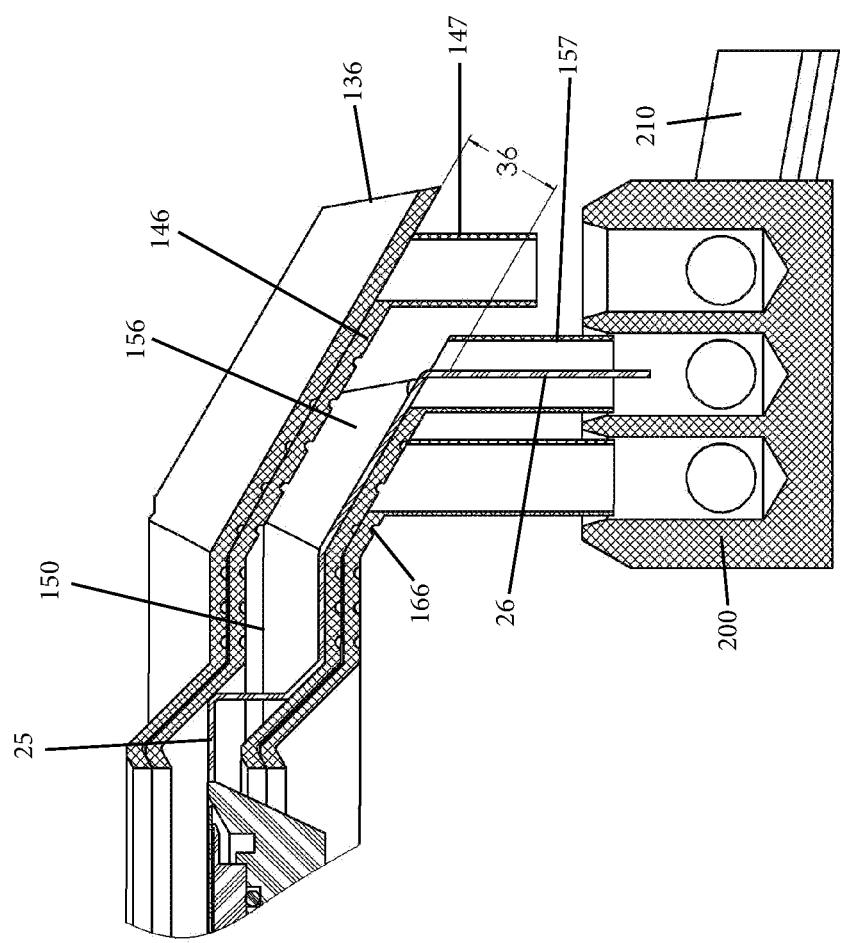
FIG. 4 shows a cross-section of the collection trays in a second fluid collection position.
Figure 9:
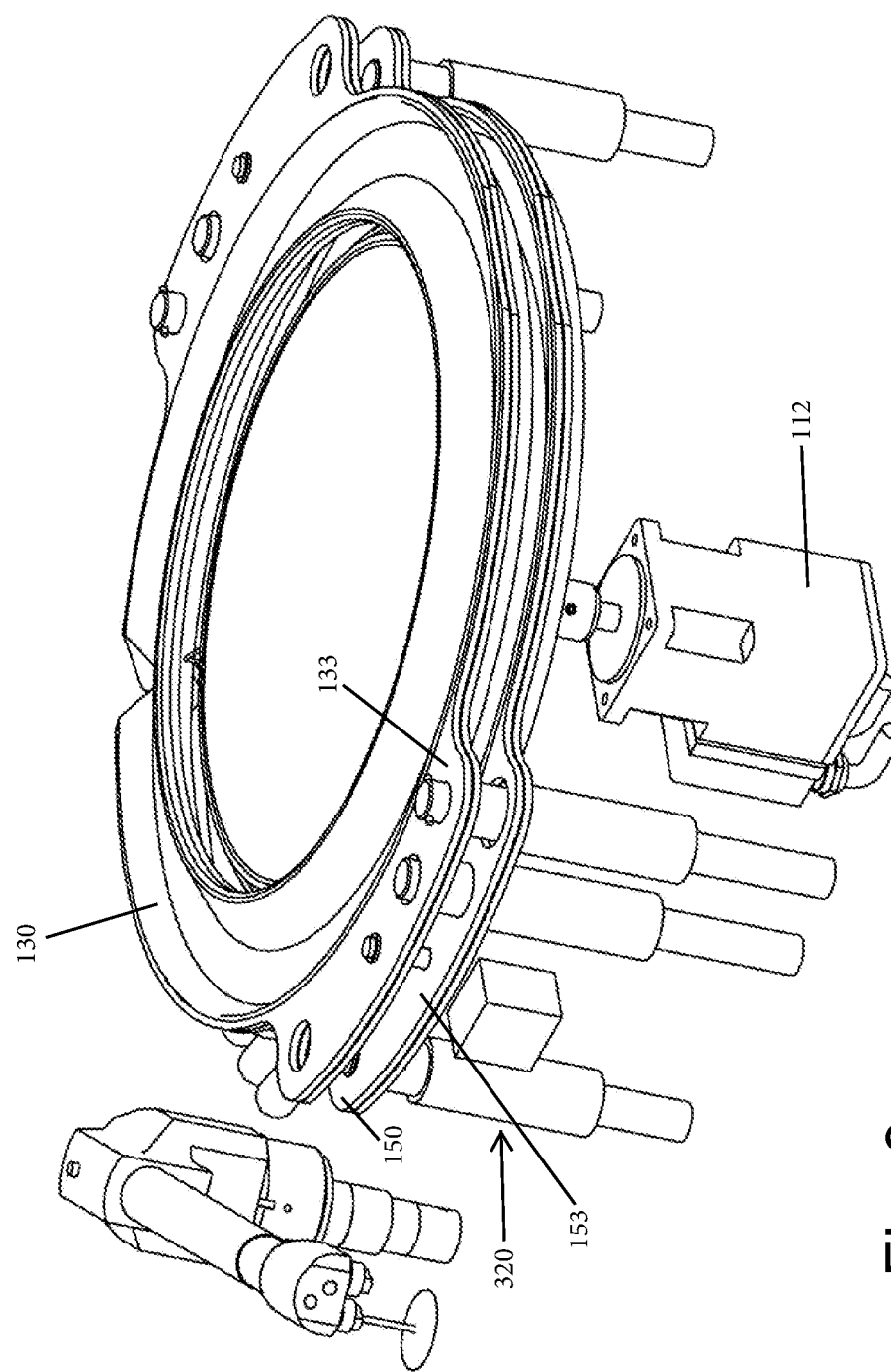
FIG. 9 is a perspective showing the apparatus in the second fluid collection position.

FIGS. 4 and 9 show the apparatus 100 with the trays 130, 140, 150, 160 forming a second collection chamber 36 (gap), positioned by a pair of pistons 310 (second pistons) in combination with the pair of pistons 300 (first pistons) which are also actuated and in their fully extended states. When the pistons 310 are actuated and move upwardly, the stepped construction of the pistons 310 is such that both the collection trays 130, 140 are supported by the first shoulder of the pistons 310 (resulting in the trays 130, 140 being in sealed contact with one another) and the trays 150, 160 seating against the second shoulder of the pistons 310. As shown the pistons 320 are not actuated. A second discrete fluid 26, flows through the chamber 36, following normal path 25 in which the fluid flows into the outlet port 156 and the fluid conduit member 157 and finally into the manifold 200. From there the fluid flows into the drain tube 210 and ends up in a discrete tank (not shown) for storage and reuse, where it is dispensed during the next wafer cycle.

Figure 5:
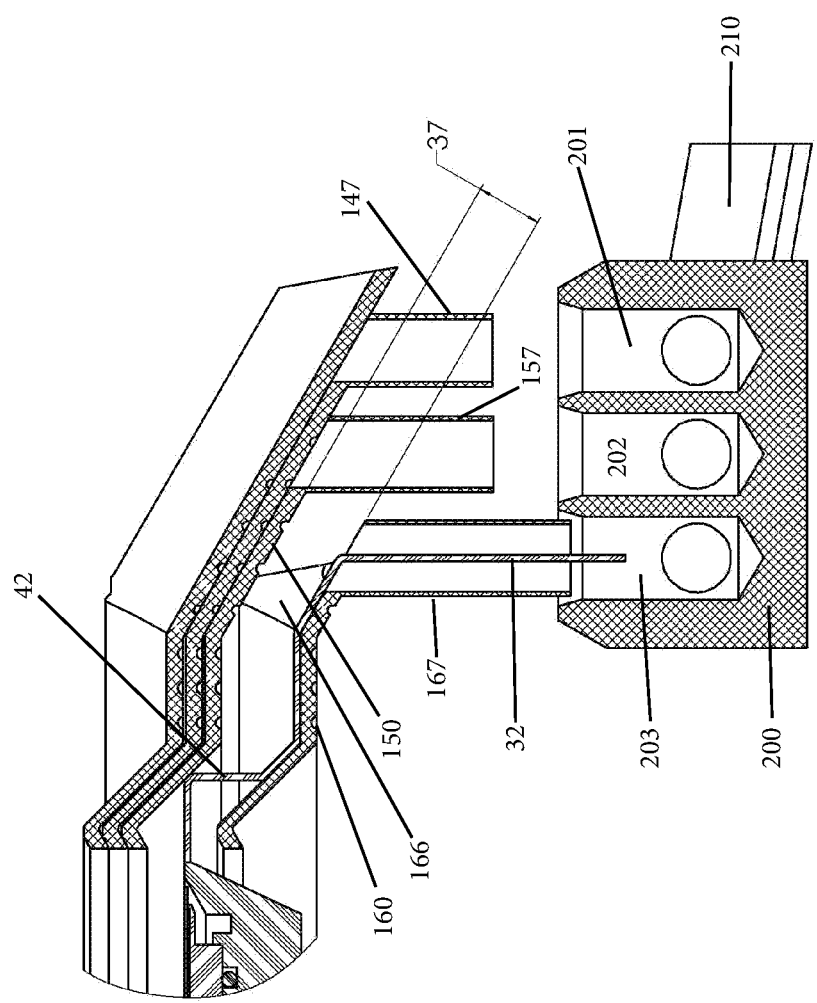
FIG. 5 shows a cross-section of the collection trays in a third fluid collection position.
Figure 10:
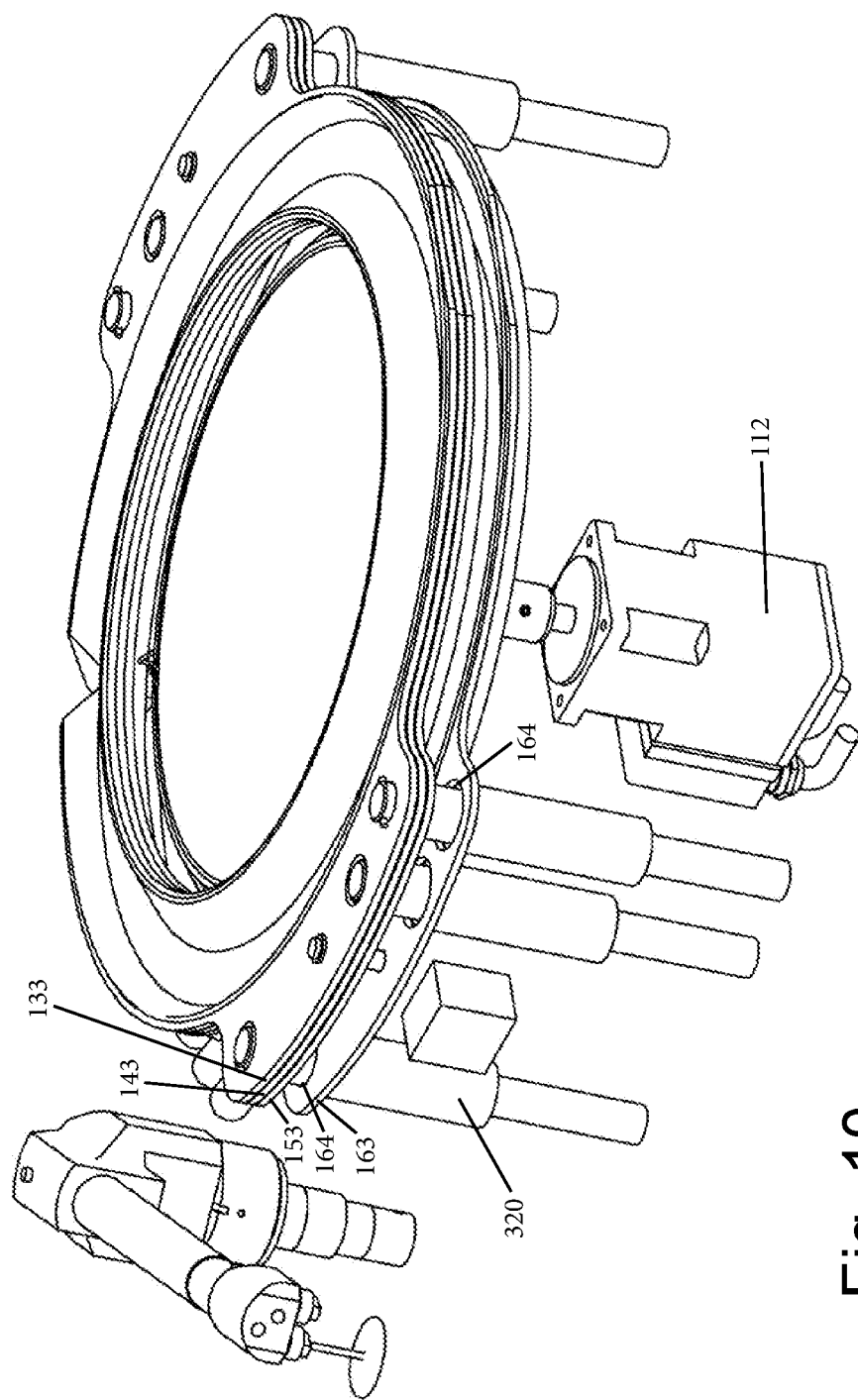
FIG. 10 is a perspective showing the apparatus in the third fluid collection position.

FIGS. 5 and 10 show the apparatus 100 with the trays 130, 140, 150, 160 forming a third collection chamber 37, positioned by a piston pair 320 (third pistons) in combination with the pair of pistons 300, 310 (first and second pistons) which are also actuated and in their fully extended states. When the pistons 320 are actuated and move upward, the stepped construction of the pistons 320 is such that the collection trays 130, 140, 150 (the three uppermost trays) are supported by the first shoulder of the pistons 310 (resulting in the trays 130, 140, 150 being in sealed contact with one another) and the tray 160 (bottommost tray) seats against the second shoulder of the pistons 320. A third discrete fluid 32, flows through the collection chamber 37 following normal path 42 in which the fluid flows into the outlet port 166 and the fluid conduit member 167 and finally into the manifold 200. From there the fluid flows into the drain tube 210 and ends up in a discrete tank (not shown) for storage and reuse, where it is dispensed during the next wafer cycle.

The distance between the two collection trays that define one specific, selected collection chamber remains the same regardless of which two collection trays 130, 140, 150, 160 define such collection chamber. This is a result of the construction of the pistons (e.g., the shoulders formed therein) and controlled distance of the strokes thereof.

Figure 8:
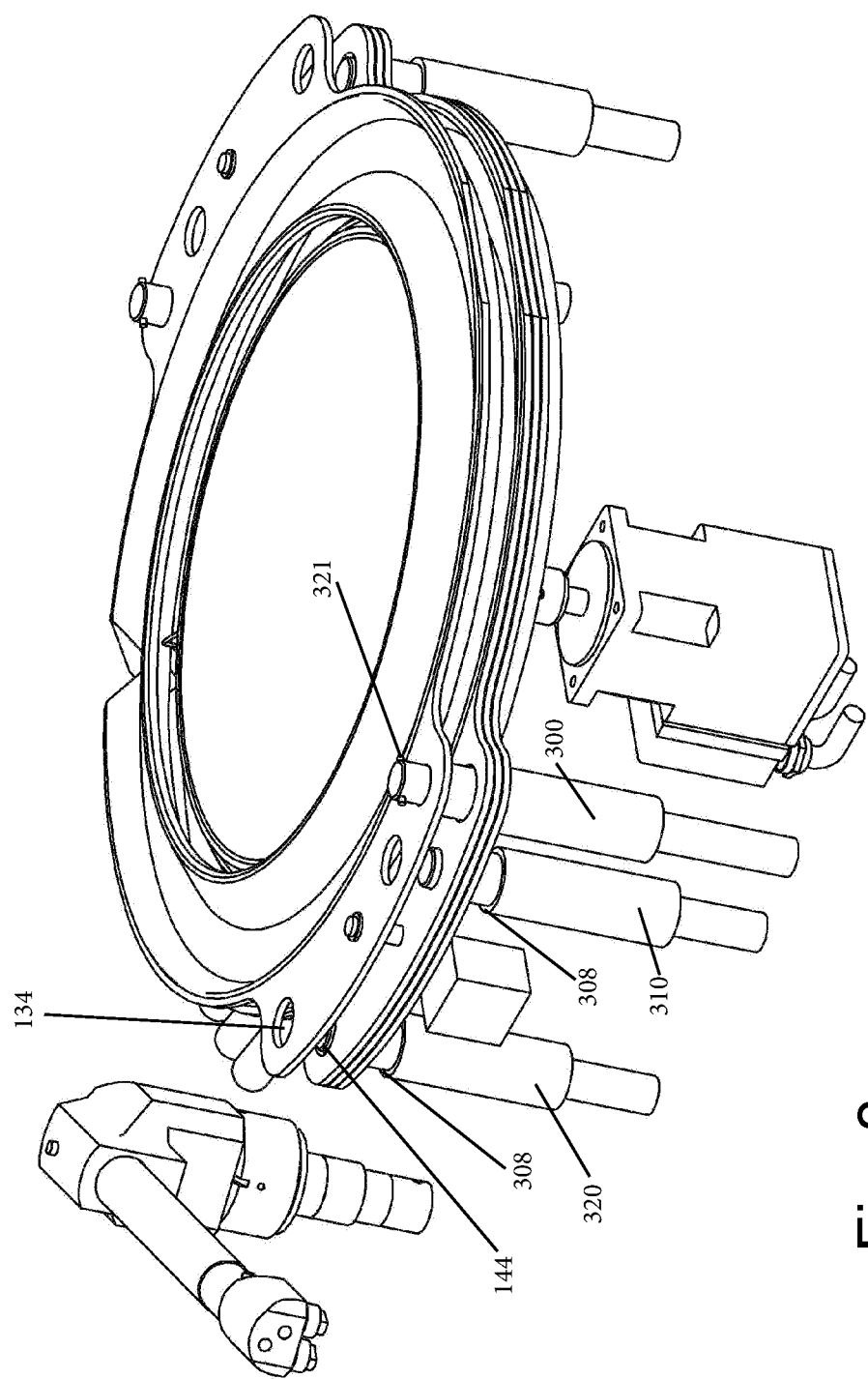
FIG. 8 is a perspective showing the apparatus in the first fluid collection position.

As shown in the FIGS. 8-10, the top end of each piston 300 can include a stop member 321 in the form of a protrusion to limit the movement of the collection tray 130 (the uppermost collection tray) in an upward direction. As will be understood, the most upward position of the collection tray 130 results in the collection tray 130 seating against this stop member 321. The stop members 321 thus assist in holding the collection tray assembly together.

Additional details and advantages of the present invention include but are not limited to: (1) the collection apparatus is able to collect multiple different fluids without cross contamination of each other, and directing each fluid into a separate drain; (2) it contains multiple collection trays which are determined by the number of fluids plus one; (3) the collection trays have the ability to stack into each other, preventing other fluids from splashing into them, thus eliminating cross contamination; (4) air cylinders with shoulders designed to vertically position and set the gap between two trays, thereby forming each collection chamber; (5) multiple drip grooves are designed into the underside of each tray, to direct fluid into the intended lower tray's drain; (6) when the collection trays are stacked together a gap is left between the upper and lower tray such that space is left for fluid that has yet to drain out of the tray, thereby preventing splashing of the fluid and (7) each fluid is discharged into a unique drain.

Referring again to FIGS. 1-10 and further to the above discussion, it will be appreciated that the collection chamber apparatus 100 includes a number of working components that are actuatable, as described below, in order to place the collection chamber apparatus 100 in different operating positions and more specifically, to create a defined collection chamber and a corresponding defined fluid flow path that allows collection of a liquid used in the wafer processing.

The collection chamber apparatus 100 includes a wafer support member 110 on which a wafer 115 is disposed during processing thereof. The wafer support member 110 is in the form of a rotatable wafer spin chuck. The spin chuck 110 is operatively connected to a motor 112 which is configured to rotate the spin chuck 110 at a selected speed (RPM). Operation of the spin chuck 110 is by traditional methods.

A fluid dispensing arm 120 represents a means for dispensing a fluid 119 onto the wafer 115. The fluid dispensing arm 120 can be any number of different types of traditional fluid dispensing members including the arm 120 shown in the figures. As described herein, during wafer processing, liquid is dispensed onto a surface of the wafer 115 and during rotation of the wafer 115, the fluid is propelled radially outward and off of the wafer 115 by centrifugal force.

In accordance with the present invention, the collection chamber assembly of the apparatus 100 is disposed circumferentially about the spin chuck 110 and thus, is disposed circumferentially about the wafer 115. As mentioned above, the collection chamber component comprises a plurality of collection trays that serve to not only collect the fluid being propelled radially outward off of the wafer 115 during the processing thereof but also routes the fluid to an outlet to facilitate collection of the fluid. In the illustrated embodiment, which is exemplary in nature, there are four different collection trays 130, 140, 150, 160 that are arranged in a stacked configuration. However, it will be understood that less than or more than four collection trays can be used in the apparatus 100. It will be appreciated that the addition of one collection tray results in a corresponding addition of a distinct collection chamber for collecting a fluid. This aspect will be readily understood from the below discussion and from the drawing figures.

The collection trays 130, 140, 150, 160 can have the same or similar basic design as shown in the figures. In the illustrated embodiment, the collection tray 130 is generally annular shaped with a center opening 131 that receives the spin chuck 110 and the wafer 115. The collection tray 130 has a main section that defines an annular shaped collection track 132 which is defined by a floor and a pair of beveled side walls that are adjacent and slope up from the floor. Alternative floor design is equally possible and the illustrated design is only exemplary in nature.

As shown in FIG. 1, the collection tray 130 also has a pair of outwardly extending flange sections 133. The flange sections 133 are preferably located opposite one another (e.g., 180 degrees apart) and have a plurality of openings 134 formed therein. The openings 134 are spaced along the flange section between the side walls thereof. In the illustrated embodiment, there are three openings 134 that receive working pistons (e.g., ends of pneumatic (air) cylinders) as described below. There is also an additional opening 135 formed in each flange section 133. The openings 134, 135 can be arranged such that the two openings 134 are adjacent one another and the third opening 134 is spaced from this pair of openings 134 with the opening 135 being disposed between the pair of openings 134 and the spaced third opening 134.

The collection tray 130 also includes an outlet port 136 which is in fluid communication with the fluid collection track 132. The outlet port 136 can be in the form of a spout that extends radially outward from the main section between the flange sections 133. In the illustrated embodiment, the outlet port 136 is generally V-shaped and extends outward from the main section and thus provides a trough along which the collected fluid flows. The bottom of the outlet port 136 is in fluid communication with the bottom (floor) of the fluid collection track 132 and thus fluid can flow from the fluid collection track 132 into the outlet port 136. As will be described below, the outlet port of each collection tray is in fluid communication with the manifold structure 200 to route the collected fluid.

The collection tray 140 is similar to the collection tray 130 and is generally annular shaped with a center opening 141 that receives the spin chuck 110 and the wafer 115. The collection tray 140 has a main section that defines an annular shaped collection track 142 which is defined by a floor and a pair of beveled side walls that are adjacent and slope up from the floor.

The collection tray 140 also has a pair of outwardly extending flange sections 143. The flange sections 143 are preferably located opposite one another (e.g., 180 degrees apart) and have a plurality of openings 144 formed therein. The openings 144 are spaced along the flange section between the side walls thereof. In the illustrated embodiment, there are three openings 144 that receive working pistons (e.g., ends of pneumatic (air) cylinders) as described below. There is also an additional opening 145 formed in each flange section 143. The openings 144, 145 can be arranged such that the two openings 144 are adjacent one another and the third opening 144 is spaced from this pair of openings 144 with the opening 145 being disposed between the pair of openings 144 and the spaced third opening 144.

The collection tray 140 also includes an outlet port 146 which is in fluid communication with the fluid collection track 142. The outlet port 146 can be in the form of a spout that extends radially outward from the main section between the flange sections 143. In the illustrated embodiment, the outlet port 146 is generally V-shaped and extends outward from the main section and thus provides a trough along which the collected fluid flows. The bottom of the outlet port 146 is in fluid communication with the bottom (floor) of the fluid collection track 142 and thus fluid can flow from the fluid collection track 142 into the outlet port 146.

The collection tray 150 is similar to the other collection trays and is generally annular shaped with a center opening 151 that receives the spin chuck 110 and the wafer 115. The collection tray 150 has a main section that defines an annular shaped collection track 152 which is defined by a floor and a pair of beveled side walls that are adjacent and slope up from the floor.

The collection tray 150 also has a pair of outwardly extending flange sections 153. The flange sections 153 are preferably located opposite one another (e.g., 180 degrees apart) and have a plurality of openings 154 formed therein. The openings 154 are spaced along the flange section between the side walls thereof. In the illustrated embodiment, there are three openings 154 that receive working pistons (e.g., ends of pneumatic (air) cylinders) as described below. There is also an additional opening 155 formed in each flange section 153. The openings 154, 155 can be arranged such that the two openings 154 are adjacent one another and the third opening 154 is spaced from this pair of openings 154 with the opening 155 being disposed between the pair of openings 154 and the spaced third opening 154.

The collection tray 150 also includes an outlet port 156 which is in fluid communication with the fluid collection track 152. The outlet port 156 can be in the form of a spout that extends radially outward from the main section between the flange sections 153. In the illustrated embodiment, the outlet port 156 is generally V-shaped and extends outward from the main section and thus provides a trough along which the collected fluid flows. The bottom of the outlet port 156 is in fluid communication with the bottom (floor) of the fluid collection track 152 and thus fluid can flow from the fluid collection track 152 into the outlet port 156.

The collection tray 160 is generally annular shaped with a center opening 161 that receives the spin chuck 110 and the wafer 115. The collection tray 160 has a main section that defines an annular shaped collection track 162 which is defined by a floor and a pair of beveled side walls that are adjacent and slope up from the floor.

The collection tray 160 also has a pair of outwardly extending flange sections 163. The flange sections 163 are preferably located opposite one another (e.g., 180 degrees apart) and have a plurality of openings 164 formed therein. The openings 164 are spaced along the flange section between the side walls thereof. In the illustrated embodiment, there are three openings 164 that receive working pistons (e.g., ends of pneumatic (air) cylinders) as described below. There is also an additional opening 165 formed in each flange section 163. The openings 164, 165 can be arranged such that the two openings 164 are adjacent one another and the third opening 164 is spaced from this pair of openings 164 with the opening 165 being disposed between the pair of openings 164 and the spaced third opening 164.

The collection tray 160 also includes an outlet port 166 which is in fluid communication with the fluid collection track 162. The outlet port 166 can be in the form of a spout that extends radially outward from the main section between the flange sections 163. In the illustrated embodiment, the outlet port 166 is generally V-shaped and extends outward from the main section and thus provides a trough along which the collected fluid flows. The bottom of the outlet port 166 is in fluid communication with the bottom (floor) of the fluid collection track 162 and thus fluid can flow from the fluid collection track 162 into the outlet port 166.

As mentioned above, the collection trays 130, 140, 150, 160 are arranged in a stacked configuration and thus the respective flange sections are stacked on top of each other and are configured to mate with one another and the respective outlet ports are disposed on top of one another as shown.

The outlet ports 136, 146, 156, 166 thus resemble angled troughs/spouts which permit fluid to flow downward by gravity. As best shown in FIGS. 3A and 3B, each of the outlet ports 146, 156, and 166 includes a fluid conduit member 147, 157, 167, respectively, which descends downwardly therefrom. As shown, each of the fluid conduit members 147, 157, 167 can be in the form of a tubular structure that communicates at a top open end with the bottom of the respective outlet port. The fluid conduit members 147, 157, 167 can be vertically oriented and thus, fluid flows by gravity from the respective outlet port into the fluid conduit member to a separation manifold 200. As shown in FIGS. 4 and 5, the fluid conduit members 147, 157, 167 are slidingly received within respective inlet ports 201, 202, 203 of the manifold to establish a fluid connection. The manifold 200 includes a drain tube 210 which is in fluid communication with each of the fluid conduit members and thus, fluid flowing through the fluid conduit member flows into the manifold and into the drain tube 210. The drain tube 210 routes the fluid to a predetermined location such as a location at which a collection tank is provided for collecting the fluid.

The collection aspect of the apparatus 100 is based on the fact that the individual collection trays 130, 140, 150, 160 can each be moved to a predetermined position so as to define a discrete collection chamber that is configured to collect the fluid that is propelled outwardly off of the wafer during processing. It will be appreciated that different means for moving the collection trays can be used and the ones described herein are merely exemplary in nature. In the illustrated embodiment, pneumatic devices are used to control the movement of the trays and in particular, pistons in the form of air cylinders are used. To move the multiple (e.g., 4) collection trays, there are multiple pistons and in particular and according to one embodiment, when the apparatus includes n number of collection trays, there are 2*(n−1) number of pistons. Further, it will be appreciated that each tray can be moved by one or more piston and thus, while the illustrated embodiment shows pistons being arranged in pairs, other variations are equally possible. For example, sets of three pistons can be used instead to move the collection trays. To provide the proper support, it is desired that there be at least two pistons for moving a respective collection tray (e.g., as mentioned, there can be three or more pistons used per collection tray).

As shown, there is a pair of first pistons 300, a pair of second pistons 310, and a pair of third pistons 320. The pistons 300, 310, 320 are arranged below the flange sections of the collection trays and are axially aligned with select ones of the openings 134, 144, 154, 164. The openings 134, 144, 154, 164 are axially aligned with one another and differ in only dimensions (i.e., diameters thereof), thereby allow at least a portion of the piston to pass through select openings. Each piston 300, 310, 320 includes a stepped construction so as to create select interference with the tray so as to effectuate a lifting of a select tray.

For the purpose of illustration and as described below, the pair of first pistons 300 is designed to lift the collection trays 130, 140; the pair of second pistons 310 is designed to lift the collection trays 140, 150 and the pair of third piston 320 is designed to lift the collection trays 150, 160. In other words, each pair of pistons is designed to lift two collection trays; however, in combination with other pairs of pistons being actuated, more than two collection trays are moved.

As shown best in FIG. 6, the stepped construction of the first piston 300 is defined by a first shoulder 307 and a second shoulder 308. The outer diameter of the second shoulder 308 is greater than the first shoulder 307. The piston 300 thus has a variable diameter and in particular, includes a first region between the first shoulder 307 and top end that has a first outer diameter; a second region between the two shoulders that has a second outer diameter and a third region below the second shoulder 308 that a third diameter, wherein the first outer diameter<second outer diameter<third outer diameter. The openings 134, 144, 154, 164 are purposely sized so that only one or more of the regions is free to pass therethrough and the shoulders 307, 308 create lifting surface for lifting select collection trays.

Figure 7:
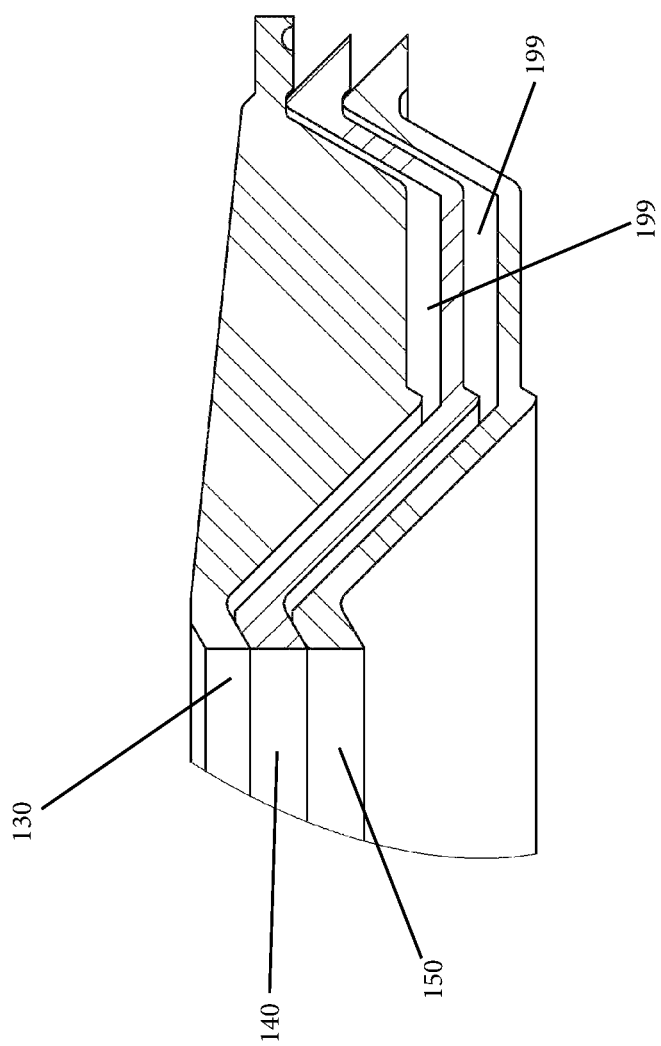
FIG. 7 is close-up cross-sectional view of stacked collection trays which include cavities left between the collection trays to reduce fluid splashing when the collection trays are closed.

As shown in FIG. 7, the collections trays are configured to include an anti-splash feature. More specifically, a fluid reservoir 199 is formed between adjacent closed collection trays to reduce fluid splashing when the collection trays are closed. More particularly, the underside of one collection tray and the topside of the collection tray immediately beneath it leave the fluid reservoir 199 between them when the two trays are collapsed. The fluid reservoir prevents fluid from being squeezed or splashed out from between the trays when the trays are closed. FIG. 7 shows collections trays 130, 140, 150 in closed positions, with one fluid reservoir 199 being formed between the collection trays 130, 140 and another fluid reservoir 199 being formed between the collection trays 140, 150.

FIGS. 14A and 14B illustrate a collection chamber apparatus according to another exemplary embodiment of the present invention. It will be appreciated that FIGS. 14A and 14B only illustrate a cross-sectional localized view of an arrangement of collection trays that are part of the collection chamber apparatus. The collection trays illustrated in FIGS. 14A and 14B can therefore be implemented in a collection chamber apparatus similar to the one disclosed in FIGS. 1-10. More specifically and as described in more detail below, the collection chamber apparatus includes an arrangement of collection trays that are independently movable in a controlled manner and surround a wafer that is situated on a rotatable chuck.

As with the previous embodiment, by creating discrete collection chambers that can be sealed off with respect to one another, any spray from different processing chemicals can be collected in different collection chambers. For example, collection chamber 1 is provided for collection of a first chemical; collection chamber 2 is provided for collection of a second chemical, etc. Since each collection chamber is sealed from the others, cross-contamination of the chemicals is avoided.

Figure 11:
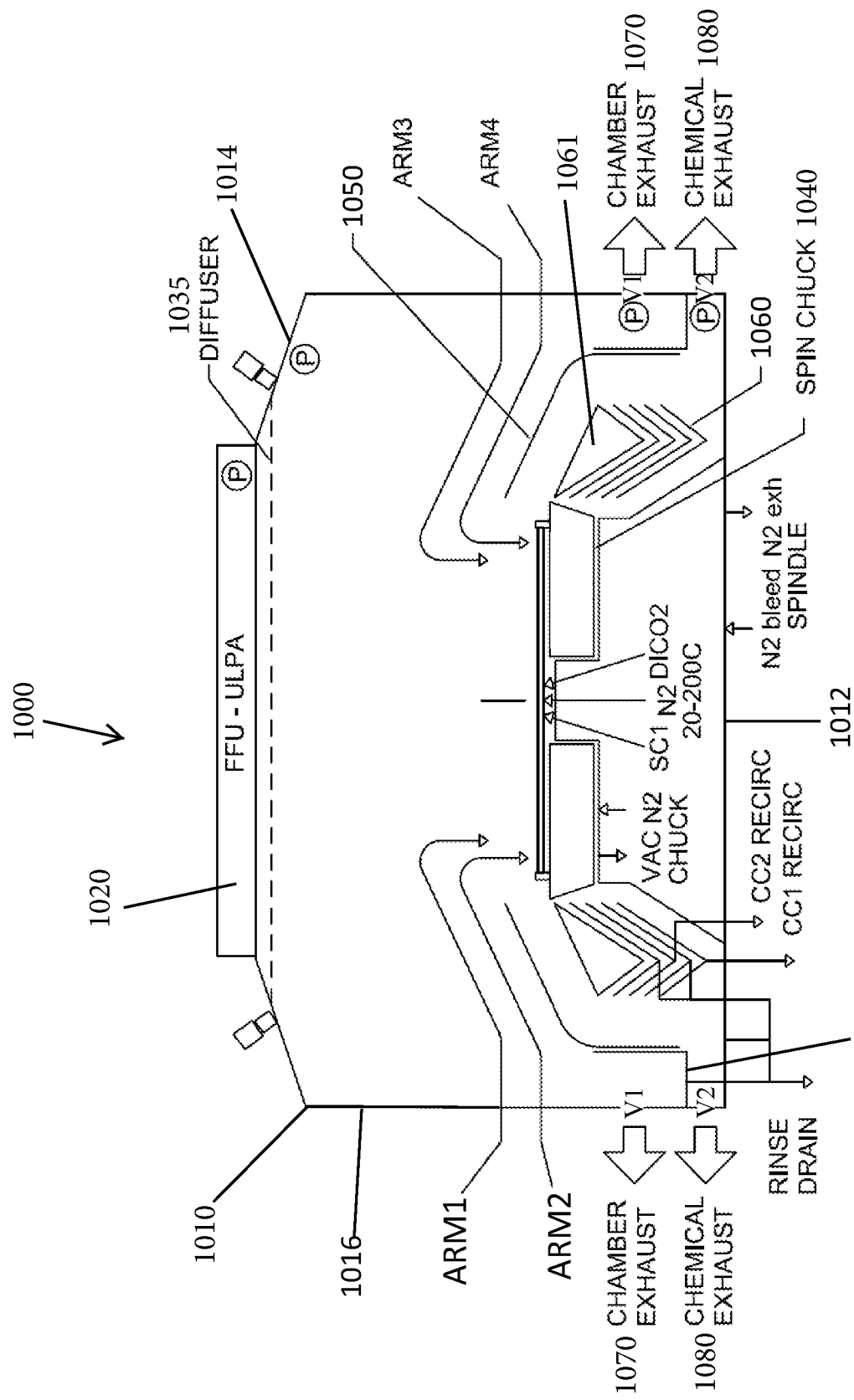
FIG. 11 is cross-sectional side view of an exemplary semiconductor wafer processing chamber in accordance with another embodiment.

FIG. 11 is a general overview of a piece of wafer processing equipment that is configured for the wet treatment of a plate-like article (i.e., a wafer) and in particular, illustrates a semiconductor wafer processing chamber 1000 that is defined by a housing 1010. The housing 1010 has a hollow interior in which working components of the wafer processing equipment are disposed as discussed herein. The housing 1010 is thus defined by a bottom wall (floor) 1012, an opposite top wall 1014 and a side wall 1016 that extends between the bottom wall 1012 and the top wall 1014. The housing 1010 can be square or rectangular shaped and therefore, includes four side walls 1016. The housing 1010 includes a number of exhaust features for distributing and venting gas as discussed herein.

The housing 1010 can include a filter fan unit (FFU-ULPA) 1020 that is disposed along the top wall 1014 of the housing 1010 and is in fluid communication with the hollow interior of the housing 1010. The filter fan unit 1020 is configured to generate air flow within the hollow interior and is thus, part of an exhaust/venting system as described below. The filter fan unit 1020 preferably utilizes ULPA filtration with a target of ISO class 1 output with ISO class 1000 inlet supply air. In other words, the filter fan unit 1020 has a filter component and a fan component. The fan component is a variable speed fan that cooperates with exhaust throttle valves to allow the housing to be maintained at either a net positive or negative pressure in respect to the surrounding environment. The filter fan unit 1020 has a pressure detection feature that indicates when the filter media needs to be replaced or when there is a failure. In particular, a computer module that is operatively connected to the filter fan unit 1020 monitors differential pressure to detect when the filter media requires changing or when there is system failure. A differential pressure transmitter is connected between the interior of the filter fan unit and the interior of chamber (housing 1010).

As also shown in the drawings, a diffuser 1035 can be provided below the fan filter unit 1020. The diffuser 1035 can consist of a plate with rinse nozzles (e.g., ambient deionized water (DI) nozzles) between the plate and the fan filter unit 1020 surrounding the peripheral edges for the purpose of rinsing down the entire interior surfaces of the outer walls of the chamber 1000. The diffuser 1035 can also accommodate mounting of a camera.

The semiconductor wafer processing chamber 1000 also includes a rotatable spin chuck 1040. Any number of different spin chucks 1040 can be used in accordance with the present invention and therefore, the structure of the spin chuck 1040 will vary depending upon the type of spin chuck 1040 that is implemented. For example, one type of spin chuck 1040 is configured to hold and rotate the wafer and includes a gas supply means for directing gas towards the face of the wafer, which is facing the spin chuck, wherein the gas supply means comprises a gas nozzle rotating with the spin chuck, for providing a gas cushion between the plate-like article and the spin chuck. Such a chuck is commonly known as Bernoulli-Chuck because the plate-like article is pulled towards the chuck by vacuum generated due to the aerodynamic paradox called Bernoulli-Effect. Such Bernoulli-chucks may comprise radially movable pins, wherein the pins securely hold the plate-like article even if no pressurized gas is providing the Bernoulli-Effect.

It will be understood that other types of spin chucks 1040 can be used including but not limited to air bearing, gas sealed, pedestal and vacuum chucks.

The spin chuck 1040 is centrally located within the housing 1010 below the spin shield 1030 and in the case of a Bernoulli type chuck, as illustrated, is fluidly connected to one or more fluids (gases and/or liquids). A main spindle is provided and is operatively coupled to the spin chuck 1040 for controlled rotation thereof under action of a motor, such as a frameless three phase servo motor with a rotor directly coupled to the spin chuck 1040. The spin shield 1030 serves to protect against fluid redeposit on the spin chuck 1040. The spin shield 1030 can not only be positioned in a full raised position and a full lowered position but also can be placed in a partially raised position.

The semiconductor wafer processing chamber 1000 also preferably includes a movable splash shield 1050. The splash shield 1050 is disposed external to the spin chuck 1040 and in particular, the splash shield 1050 surrounds the spin chuck 1040. The splash shield 1050 is operatively coupled to an actuator to allow for the controlled raising and lowering of the splash shield 1050. In other words, the splash shield 1050 moves in a vertical direction within the housing 1010 between a raised position and a retracted position. The splash shield 1050 thus can have an outer wall portion and an inwardly angled top wall portion. A free end of the inwardly angled top wall portion is disposed proximate the outer edge of the spin chuck 1040.

The splash shield 1050 also serves a role in the fluid flow dynamics within the housing 1010, as described below, in that gas flow paths within the chamber interior depends at least in part on the position of the splash shield 1050. In particular, there can be two distinct flow paths within the housing interior for venting gas (fumes) that are generated within the housing interior during the wafer processing. Venting of this gas is desirable since undesired gas buildup within the housing interior can lead to condensate forming on the wafer. The two distinct gas flow paths are described below.

The semiconductor wafer processing chamber 1000 also preferably includes a plurality of fluid collectors 1060 which can be in the form of fluid collection (trays) cups that are configured to collect fluid (chemistry) that is discharged from the top of the rotating wafer due to centrifugal forces. The fluid collectors 1060 generally are in the form of stacked annular shaped collectors that have a collection space, such as a trough, and are each independently movable between a raised position and a lowered position. The fluid collectors 1060 are configured to nest with each other as shown. A fluid collection chamber is defined between one or more raised fluid collectors 1060 and one or more lowered fluid collectors 1060. The fluid collectors 1060 surround the spin chuck 1040 and are disposed between the splash shield 1050. Each of the fluid collectors 1060 includes one or more drain outlets that allow the collected fluid to be routed away from the fluid collectors 1060 and more particularly, from the collection chamber for collection and reuse, etc.

There can also be a fluid collector cover 1061 that is disposed above the uppermost fluid collector 1060 and covers a trough section thereof. In one embodiment, there are two or more fluid collectors 1060 and in particular, there are three or more fluid collectors 1060 (e.g., four fluid collectors). It will also be understood that a fluid collection chamber can be defined between the cover 1061 and the uppermost fluid collector 1060.

The cover 1061 and fluid collectors 1060 are independently movable using any number of techniques, including but not limited to the drive mechanisms described in relation to FIGS. 1-10. The drive mechanism can thus be in the form of independent guided stepper driven lead screws with position feedback encoder. When actuated, the drive mechanism causes the controlled raised of one or more fluid collectors 1060. As mentioned, the fluid collectors 1060 can be nested such that as the subsequent fluid collector 1060 is actuated it pushes up and disengages the previous fluid collector 1060 from its respective actuator. The nesting is such that no overspray can occur in the fluid collector 1060 or at the drain location of the fluid collector 1060. In the case of using three fluid collectors 1060, the lower and upper fluid collectors 1060 are provided with recirculation, while the center fluid collector 1060 is used for chemical rinse between the steps.

The semiconductor wafer processing chamber 1000 includes two separate exhausts that can be throttled independently, namely, a chamber exhaust 1070 and a chemical exhaust 1080. The chamber exhaust 1070 and the chemical exhaust 1080 are separated by the splash shield 1050 and a splash shield labyrinth so as to create separate, independent flow paths within the interior of the chamber. By incorporating a valve member into each of the chamber exhaust 1070 and the chemical exhaust 1080, the respective flow rates can be altered.

The chamber exhaust 1070 is located at the outer circumference of the chamber and exhausts air past chemical dispense arms (not shown) when they are in the lowered and stowed position. As will be appreciated, the chemical dispense arms are configured to dispense fluids onto the surface of the wafer during a wafer processing operation. As shown in FIG. 11, the chamber exhaust 1070 can be in the form of an opening in the side wall of the housing 1010 at a location outside of the splash shield 1050. As described herein, fluid flows to the chamber exhaust 1070 by flowing over and around the splash shield 1050 to a dedicated exhaust outlet 1070. There can be multiple chamber exhaust outlets formed along the side wall of the housing 1010. It will also be appreciated that the chamber exhaust 1070 includes not only an outlet formed in the housing 1010 but also an external conduit that can be routed along the exterior of the housing 1010.

The chamber exhaust 1070 includes an independent first valve member V1 that is configured to control the flow through the chamber exhaust 1070. Any number of different types of valves can be used as the first valve member V1. For example, the first valve member V1 can be in the form of a butterfly valve or throttle valve.

The chamber exhaust 1070 thus exhausts gas within the chamber from areas generally outside of the fluid collectors 1060.

The chemical exhaust 1080 exhausts gas that flows through the splash shield 1050 and the chemical collectors (cups) 1060 to a chemical exhaust (outlet) that can also be formed along the side wall of the housing 1010 but is fluidly isolated from the chamber exhaust 1070. The chemical exhaust 1080 can be located adjacent the chamber exhaust 1070. As shown, a floor 1011 within the housing 1010 can separate each chamber exhaust 1070 from each chemical exhaust 1080. In particular, the chemical exhaust 1080 is only reached by flowing internally within the splash shield 1050 and/or by flowing internally within the fluid collectors 1060. The chemical exhaust 1080 thus vents gases that may have built up in the splash shield/fluid collectors area.

The chemical exhaust 1080 includes an independent second valve member V2 that is configured to control the flow through the chemical exhaust 1080. Any number of different types of valves can be used as the second valve member V2. For example, the second valve member V2 can be in the form of a butterfly valve or throttle valve. The valves V1 and V2 can be the same or different.

Figure 12B:
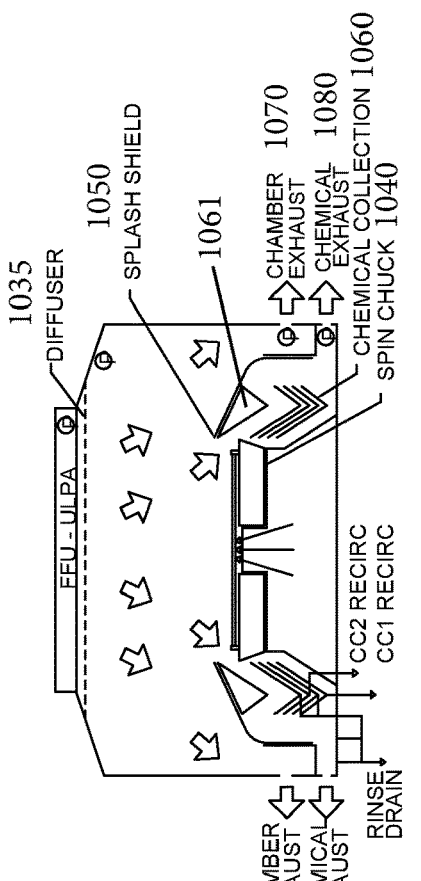
FIG. 12B is cross-section side view of the chamber of FIG. 11 in a second operating position.
Figure 12D:
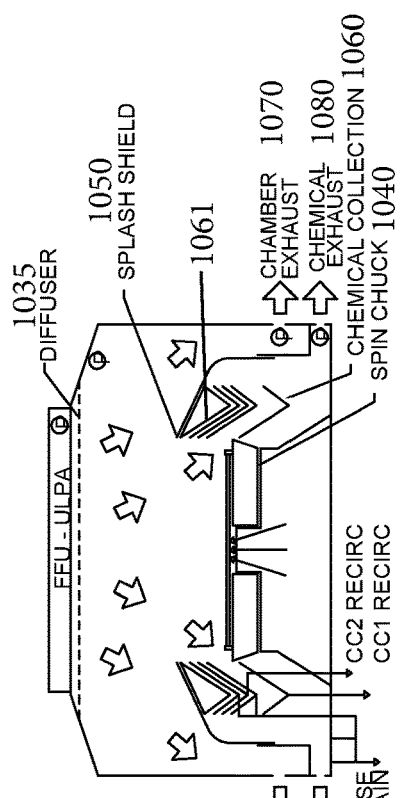
FIG. 12D is cross-section side view of the chamber of FIG. 11 in a fourth operating position.
Figure 12A:
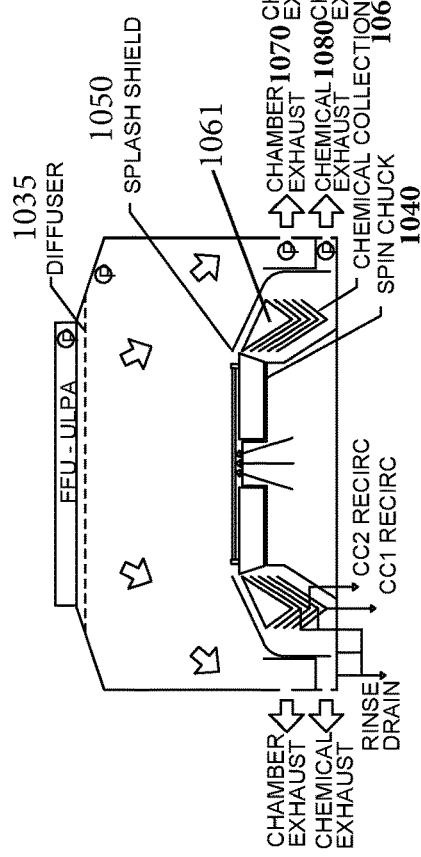
FIG. 12A is cross-section side view of the chamber of FIG. 11 in a first operating position.
Figure 12C:
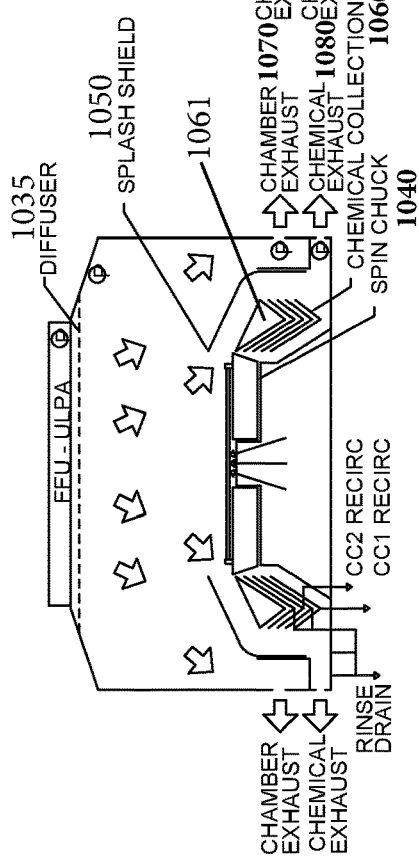
FIG. 12C is cross-section side view of the chamber of FIG. 11 in a third operating position.

FIGS. 12A-12D show various exhaust flow patterns depending upon the various positions of the splash field 1050 and the fluid collectors 1060. FIG. 12A shows the splash shield 1050 in the retracted (lowered) position and the cover 1061 and fluid collectors 1060 in the lowered positions. As shown by the arrows which indicate fluid flow, fluid (air) is exhausted by flowing over the retracted dispensing arms (See, FIG. 11: arms 1, 2, 3, 4) and the splash shield 1050 to the chamber exhaust 1070. Since the collector cover 1061, along with all of the collectors 1060, and the splash shield 1050 are retracted, fluid does not flow into the fluid collectors 1060 to the chemical exhaust 1080. FIG. 12B shows the splash shield 1050 in a raised position and the collector cover 1061 and fluid collectors 1060 in the retracted (lowered) position. As shown, a portion of the exhaust gas (air) flows above and over the splash shield 1050 to the chamber exhaust 1070 and another portion of the exhaust gas is drawn into a space between the splash shield 1050 and the collector cover 1061 where it then flows to the chemical exhaust 1080. FIG. 12C shows the splash shield 1050 and the collector cover 1061 in the raised positions, while the fluid collectors 1060 are in the lowered position. A portion of the exhaust gas (air) flows above and over the splash shield 150 to the chamber exhaust 1070 and another portion of the exhaust gas is drawn into a space (first collection chamber) between the collector cover 1061 and the topmost fluid collector 1060 where it then flows to the chemical exhaust 1080. It will be appreciated that the degree of which the splash shield 1050 is raised influences the volume of gas that flows to the chemical exhaust 1080. FIG. 12D shows a position in which the splash shield 1050, the collector cover 1061 and three of the four fluid collectors 1060 are in the raised position. Only the fourth fluid collector 1060 which represents the bottommost fluid collector is in the retracted (lowered) position, thereby defining a collection chamber for collecting fluid expelled from the rotating wafer. A portion of the exhaust gas (air) flows above and over the splash shield 1050 to the chamber exhaust 1070 and another portion of the exhaust gas is drawn into a fourth collection chamber (defined between the third and fourth fluid collectors) where it then flows to the chemical exhaust 1080.

As shown in FIGS. 12A-12D, the chamber can include a plurality of pressure transducers (P) that are located throughout the chamber including at locations at or near the chamber exhaust 1070 and the chemical exhaust 1080. Measurements at the pressure transducers can be used as part of a process to monitor interior gas flow and to control the operation of the valve members V1 and V2. In addition, feedback from the pressure transducers can be used to control the speed of the filter fan unit 1020.

It will also be understood that the gas source that is exhausted through the two exhaust outlets 1070, 1080 can be via the fan filter unit 1020 or may simply be the ambient air around the chamber (when there is no fan filter unit 1020 and just a lower chamber). Please note that the gas source may be air or any suitable gas, such as nitrogen or other gases.

As discussed above with respect to the embodiment of FIGS. 1-10, as the motor 112 rotates a wafer 115 located on the spin chuck 110, the dispense arm 120 then centers over the wafer 115 and dispenses the first fluid in the process. The motor 112 increases RPM's to spread fluid over the wafers surface, excess fluid 22 is slung by centrifugal force off the peripheral edge of the spin chuck 110 and onto the underside of one collection tray. Gravity drops the fluid into the underlying collection tray where it flows into the outlet port and finally into a manifold 200. From there the fluid flows into the drain tube 210 and ends up in a discrete tank (not shown) for storage and reuse, where it is dispensed during the next wafer cycle. While the embodiment shown in FIGS. 1-10 performed in a satisfactory manner, at times, fluid could splash out between the spaced collection trays. For example, in the collection tray position shown in FIG. 3A, fluid could travel in a lateral direction between the raised collection tray and the underlying collapsed collection tray(s) and splash outside the peripheral edges of the collection trays. This leads to not only a potentially messy condition but also leads to fluid waste.

Figure 13B:
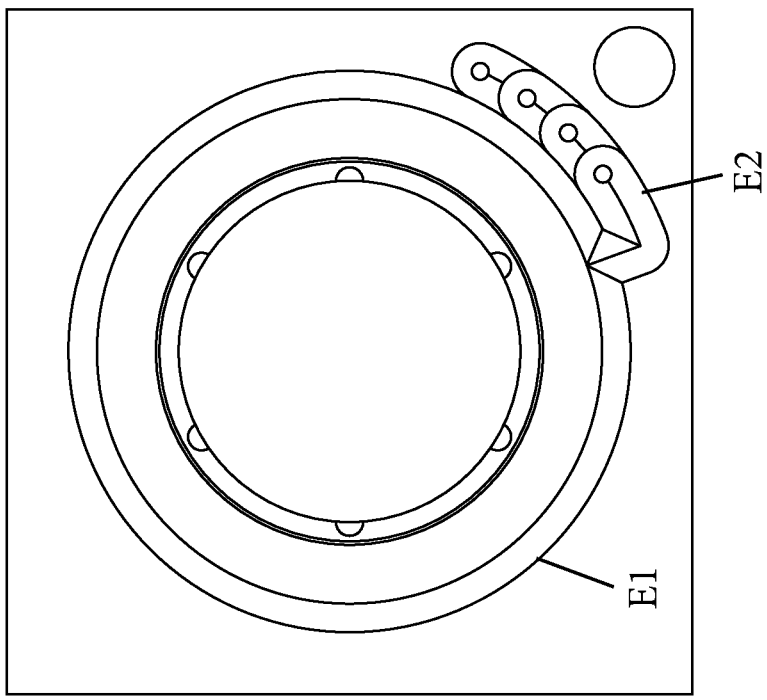
FIG. 13B is a bottom plan view of the stackable collection trays (cups) illustrating drainage features thereof.
Figure 13A:
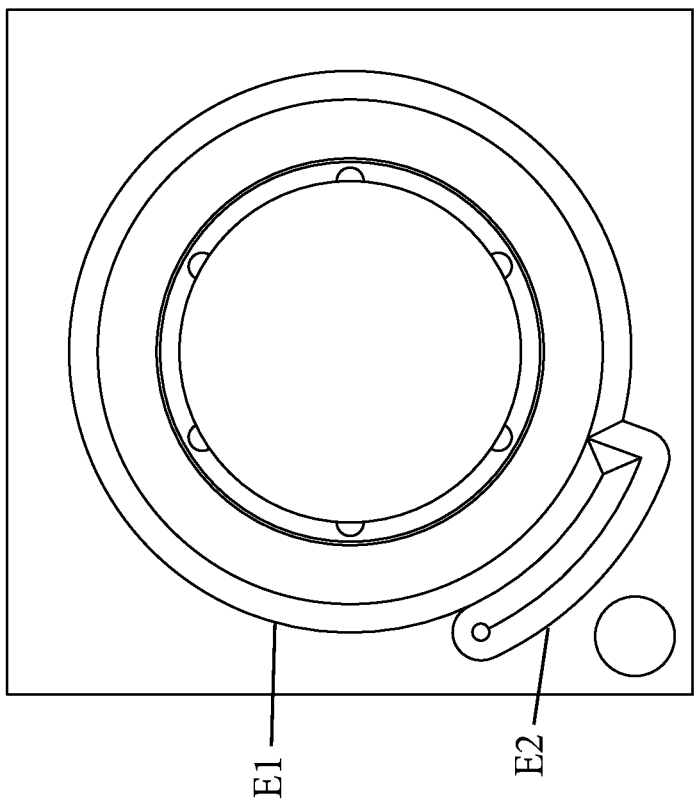
FIG. 13A is a top plan view of one exemplary arrangement of stackable collection trays (cups) illustrating drainage features thereof.

FIGS. 13A, 13B, 14A and 14B provide a solution to the aforementioned deficiency. FIG. 13A shows a top view of a plurality of stacked fluid collections (collector trays or cups) with drainage features being shown. In the embodiment shown in FIGS. 1-10, the drainage plumbing is in the form of each collection tray have an outlet port (spout) that extends radially outward from the main section between the flange sections of the collection tray. In the embodiment shown in FIGS. 13A and 13B, the drainage plumbing (drain conduits) for each collection tray extends in a tangential manner as opposed to the radially extending manner shown in FIGS. 1-10. The drainage plumbing (drain conduits) of the collector trays can still be in a stacked relationship; however, each extends in arcuately along a circumference of the main sections of the collection trays as shown. In addition and unlike the embodiment of FIGS. 1-10, each drainage conduit is defined by an outer edge (E2) that is at the same height as the height of the outer edge (E1) of the main section of the collection tray. This relationship ensures that fluid passing from the collection tray into the drain conduit does not splash out.

FIGS. 11, 12A and 12B generally show fluid collectors 1060 which can take any number of different forms including the collection trays discussed with respect to FIGS. 1-10. In addition, the fluid collectors 1060 can take the form of the fluid collectors (collection trays or cups) illustrated in FIGS. 14A-20 as discussed below.

FIGS. 14A and 14B illustrate a localized portion of a semiconductor wafer processing chamber, such as wafer processing chamber 1000 (FIG. 11). As can be seen, an outer peripheral edge of the chuck 1040 is visible. The collection chamber apparatus of this embodiment includes a collection tray arrangement or assembly 400 and an outer collection tray outer housing 450 in which the collection tray arrangement 400 is disposed. The collection tray outer housing 450 is a hollow part that circumferentially surrounds the chuck 1040. As shown, the collection tray outer housing 450 can include an inner divider wall 452 that partitions the hollow interior space of the collection tray outer housing 450 into a first compartment 460 and a second compartment 470 that is located radially outward from the first compartment 460 (the first compartment 460 is thus located adjacent to an outer peripheral edge of the chuck 1040, while the second compartment 470 is spaced radially therefrom. It will be appreciated that the collection tray outer housing 450 thus has an annular shape and both the first and second compartments 460, 470 have an annular shape.

The first compartment 460 is configured to hold the collection tray arrangement 400 in such a manner, as described below, that each collection tray can be moved (i.e., raised or lowered). While the first compartment 460 is shown as having a greater area compared to the second compartment 470, this is merely one exemplary embodiment and it will be understood that the shapes of the two compartments 460, 470 and the relative sizes thereto are not limited to what is shown in the figures. As shown, the first compartment 460 is defined by an inner wall 462 that is proximate the outer edge of the wafer 115 and terminates in a top edge 463. The first compartment 460 is also defined by the divider wall 452 which is parallel to the inner wall 462 and terminates in a top edge 454. The height of the divider wall 452 is less than the height of the inner wall 462 and thus, the top edge 454 lies below the top edge 463. The top edges 454, 463 can be beveled as shown or can be flat. A bottom wall 457 defines the bottom of the compartment and thus, acts as a floor.

The second compartment 470 is defined by an outer wall 472 and the divider wall 452 and the bottom of the second compartment 470 is defined by the bottom wall 457. The outer wall 472 is parallel to the divider wall 457. The second compartment 470 is also defined by a top wall portion 476 that has a first leg that extends toward the first compartment 460 and a second leg that is between the outer wall 472 and the divider wall 452 and is parallel thereto. The top wall portion 476 is configured and position so as to define a first opening or first passageway 480 and a second opening or second passageway 490. The first opening 480 is defined between the first leg of the top wall portion 476 and the top edge 454 of the divider wall 452 and as a result, defines a flow path from the first compartment 460 into the second compartment 470. The second opening 490 is defined between the second leg of the top wall portion 476 and the outer wall 472 and defines an outlet or exit from the second compartment 470.

The collection tray arrangement 400 is similar to the one described with respect to FIGS. 1-10 in that the arrangement 400 is defined by a plurality of stacked collection trays (collection cups) that are constructed to allow nesting therebetween. More specifically, each of the collection trays is configured to be controllably and independently raised and lowered within the first compartment 460. The collection trays serve to not only collect the fluid being propelled radially outward off of the wafer 115 during the processing thereof but also routes the fluid to an outlet to facilitate collection of the fluid.

In the illustrated embodiment, which is exemplary in nature, there are four different collection trays, namely, a first collection tray 410, a second collection tray 420, a third collection tray 430, and a fourth collection tray 440 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 410, 420, 430, 440 can have the same or similar basic design as shown in the figures. In the illustrated embodiment, the first collection tray 410 is generally annular shaped with a center opening that receives the spin chuck 110 and the wafer 115. The first collection tray 410 has a main section that defines an annular shaped collection track which is defined by an inner wall portion 413 and an outer wall portion 414 that intersect one another to define a trough 415. As shown in FIGS. 14A and 14B, the main collection portion of the first collection tray 410 is generally V-shaped.

As annotated in the figures, a bottom of the trough 415 is defined by a point A and an inner top edge of the inner wall portion 413 is defined by a point B and an outer top edge of the outer wall portion 414 is defined by a point C. Point A thus represents the lowermost point of the first collection tray 410. The relationship between the points A, B, and C is an important aspect of this embodiment. As can be seen, the inner wall portion 413 can have greater dimensions compared to the outer wall portion 414 and more specifically, the inner wall portion 413 can have a greater width compared to the outer wall portion 414 and more importantly, the inner wall portion 413 can have a greater height compared to the outer wall portion 414.

As shown in the figures, the first collection tray 410 also includes a cover portion 405 that covers the annular shaped recessed fluid collection track defined between the inner wall portion 413 and the outer wall portion 414. The cover portion 405 thus has a downwardly extending protrusion that is disposed within this annular shaped recessed fluid collection track of the first collection tray 410. The cover portion 405 thus effectively covers the trough 415 and prevents any fluid from flowing into the trough 415. While there can be a space between the cover portion 405 and the first collection tray 410 in an outer radial location thereof, it will be seen that along an innermost edge closest to the wafer, there is no space between the cover portion 405 and the first collection tray 410 and therefore, fluid that is discharged from the wafer 115 is prevented from flowing therebetween.

It will also be appreciated that the bottom point of the cover 405 can also be equated to being point A in the case in which a fluid collection chamber is defined between the raised cover portion 405 and the lowered first collection tray 410. The relevant points B and C are part of the first collection tray 410.

While not shown in the cross-sectional view of FIGS. 14A and 14B, the first collection tray 410 can have a pair of outwardly extending flange sections similar to the pair of outwardly extending flange sections 133 of the collection tray 130 (FIG. 10). The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

The first collection tray 410 includes an outlet port (drain conduit) formed at a location thereof and in particular, the outlet port can be similar to the outlet port 136 of the collection tray 130. As such, the outlet port is in fluid communication with the trough 415. The outlet port can be in the form of a spout or drain conduit that, as discussed above, extends in a tangential manner along a circumferential length of the collection tray as shown in FIG. 13. The outlet port is located at a low point of the collection tray such that fluid in the trough portion 415 of the collection tray flows to the outlet port.

The outlet port (drain conduit) can provide another trough along which the collected fluid flows. As in the embodiment of FIGS. 1-10, the outlet port of each collection tray can be in fluid communication with a manifold structure, such as the manifold structure 200 of FIGS. 1-10, to route the collected fluid away from the chuck.

The second collection tray 420 is similar to the first collection tray 410 and is generally annular shaped with a center opening that receives the spin chuck 110 and the wafer 115. The second collection tray 420 has a main section that defines an annular shaped collection track which is defined by an inner wall portion 423 and an outer wall portion 424 that intersect one another to define a trough 425. As shown in FIGS. 14A and 14B, the main collection portion of the second collection tray 420 is generally V-shaped and has a complementary shape to the first collection tray 410 to allow nesting therewith.

As annotated in the figures, a bottom of the trough 425 is defined by a point A and an inner top edge 427 of the inner wall portion 423 is defined by a point B and an outer top edge 428 of the outer wall portion 424 is defined by a point C. Point A thus represents the lowermost point of the second collection tray 420. The relationship between the points A, B, and C is an important aspect of this embodiment. As can be seen, the inner wall portion 423 can have greater dimensions compared to the outer wall portion 424 and more specifically, the inner wall portion 423 can have a greater width compared to the outer wall portion 424 and more importantly, the inner wall portion 423 can have a greater height compared to the outer wall portion 424.

The second collection tray 420 can have the same outwardly extending flange sections like the first collection tray 410 to allow for controlled raising and lowering of the second collection tray 420. The second collection tray 420 also has an outlet port as with the first collection tray 410 to allow for draining of the collected fluid.

As shown, the second collection tray 420 is located immediately below the first collection tray 410.

The third collection tray 430 is similar or identical to the second collection tray 420 and is generally annular shaped with a center opening that receives the spin chuck 110 and the wafer 115. The third collection tray 430 has a main section that defines an annular shaped collection track which is defined by an inner wall portion 433 and an outer wall portion 434 that intersect one another to define a trough 435. As shown in FIGS. 14A and 14B, the main collection portion of the third collection tray 430 is generally V-shaped and has a complementary shape to the second collection tray 420 to allow nesting therewith.

As annotated in the figures, a bottom of the trough 435 is defined by a point A and an inner top edge of the inner wall portion 433 is defined by a point B and an outer top edge of the outer wall portion 434 is defined by a point C. Point A thus represents the lowermost point of the third collection tray 430. The relationship between the points A, B, and C is an important aspect of this embodiment. As can be seen, the inner wall portion 433 can have greater dimensions compared to the outer wall portion 434 and more specifically, the inner wall portion 433 can have a greater width compared to the outer wall portion 434 and more importantly, the inner wall portion 433 can have a greater height compared to the outer wall portion 434.

The third collection tray 430 can have the same outwardly extending flange sections like the other collection trays to allow for controlled raising and lowering of the third collection tray 430. The third collection tray 430 also has an outlet port as with the other collection trays to allow for draining of the collected fluid.

The third collection tray 430 is located below the second collection tray 420.

The fourth collection tray 440 is similar to the second and third collection trays 420, 430 and is generally annular shaped with a center opening that receives the spin chuck 110 and the wafer 115. The fourth collection tray 440 has a main section that defines an annular shaped collection track which is defined by an inner wall portion 443 and an outer wall portion 444 that intersect one another to define a trough 445. As shown in FIGS. 14A and 14B, the main collection portion of the fourth collection tray 440 is generally V-shaped and has a complementary shape to the third collection tray 430 to allow nesting therewith.

As annotated in the figures, a bottom of the trough 445 is defined by a point A and an inner top edge of the inner wall portion 443 is defined by a point B and an outer top edge of the outer wall portion 444 is defined by a point C. Point A thus represents the lowermost point of the fourth collection tray 440. The relationship between the points A, B, and C is an important aspect of this embodiment. As can be seen, the inner wall portion 443 can have greater dimensions compared to the outer wall portion 444 and more specifically, the inner wall portion 443 can have a greater width compared to the outer wall portion 444 and more importantly, the inner wall portion 443 can have a greater height compared to the outer wall portion 444.

The fourth collection tray 440 can have the same outwardly extending flange sections like the other collection trays to allow for controlled raising and lowering of the fourth collection tray 440. The fourth collection tray 440 also has an outlet port as with the other collection trays to allow for draining of the collected fluid.

As with the embodiment in FIGS. 1-10, the positioning of the first, second, third, fourth collection trays 410, 420, 430, 440 defines a number of discrete collection chambers in which fluid cast off of the wafer during rotation thereof can be caught and collected, thereby avoiding splatter of the fluid.

FIG. 14A shows a first collection chamber 401 that is defined between the raised cover portion 405/first collection tray 410 and the second, third and fourth collections trays 420, 430, 440 that are in a lowered position. It will also be understood that a first collection chamber can in fact be provided between the raised cover portion 405 and the lowered first collection tray 410; however, for purposes of discussion only, the first collection chamber is described as being formed between the first collection tray 410 and the second collection tray 420.

As can be seen in FIG. 14A, when the cover portion 405 and the first collection chamber are raised to the raised position, the outer wall portion 444 is positioned proximate the first leg of the top wall portion 476 thereby defining the first passageway 480 that fluidly connects the first collection chamber to the second compartment 470. The second passageway 490 can serve as an exhaust conduit in that exhaust gas (a gas, such as air) is drawn through the first collection chamber (through the space defined between the collection trays) through the first passageway 480 to the second compartment 470 and then exits through the second passageway 490 where it can be routed to the chemical exhaust 1080 (FIG. 11). Air can thus be pulled through the collection trays (collection cups) as part of a venting process. At the same time, the chamber exhaust 1070 (FIG. 11) can be provided for venting gas outside of the collection chambers.

It will be understood that the first collection chamber 401 drains through a drain (outlet) that is in communication with the trough 425 of the second collection tray 420. FIG. 13 shows one exemplary drain conduit.

In accordance with the present invention, the bottom of the trough 415 (point A) of the raised first collection tray 410 is positioned below point B (inner top edge of the inner wall portion 423) of the second collection tray 420 and point A is preferably at the same height or is below point C (outer top edge of the outer wall portion 444). Applicant discovered that the aforementioned relationship between points (regions) A, B, and C eliminates or greatly reduces any spray splashing outside of the first collection chamber 401. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 420 into contact with the raised first collection tray 410 while the third and fourth collection trays 430, 440 are in the lowered position defines a second collection chamber for collecting fluid that is discharged from the wafer (e.g., a different fluid (chemistry) than that used in the first collection chamber). Raising the third collection tray 430 into contact with the raised second collection tray 420 while the fourth collection tray 440 is in the lowered position defines a third collection chamber for collecting fluid that is discharged from the wafer (e.g., a different fluid (chemistry) than that used in the first and second collection chambers).

It will be understood that any number of different means for raising and lowering the collection trays 410, 420, 430, 440 can be used including the user of a number of stepper motors that controllably raise different guides that can be similar in construction to the pistons 300 to allow for the controlled, independent raising and lowering of each guide. In addition, the pneumatic piston arrangement discussed with respect to FIGS. 1-10 can likewise be used to raise and lower each collection tray (by engaging the flange portions of the tray) to define the various collection chambers.

When both the second and third collection chambers are created, exhaust (gas flow) is permitted to flow through (across) the respective collection chamber, through the first passageway 480 to the second compartment 470 and then exits through the second passageway 490.

In addition, a movable splash shield can also be used with the collection tray arrangement of FIGS. 14A and 14B. The splash shield can be lowered and raised relative to the collection tray arrangement.

FIG. 14B shows the cover portion 405 and all four of the collection trays 410, 420, 430, 440 in the lowered position. Exhaust gas (air gas) can flow across the top of the cover portion 405, through the first passageway 480 to the second compartment 470 and then exits through the second passageway 490 to the chemical exhaust 1080 (FIG. 11).

Figure 20:
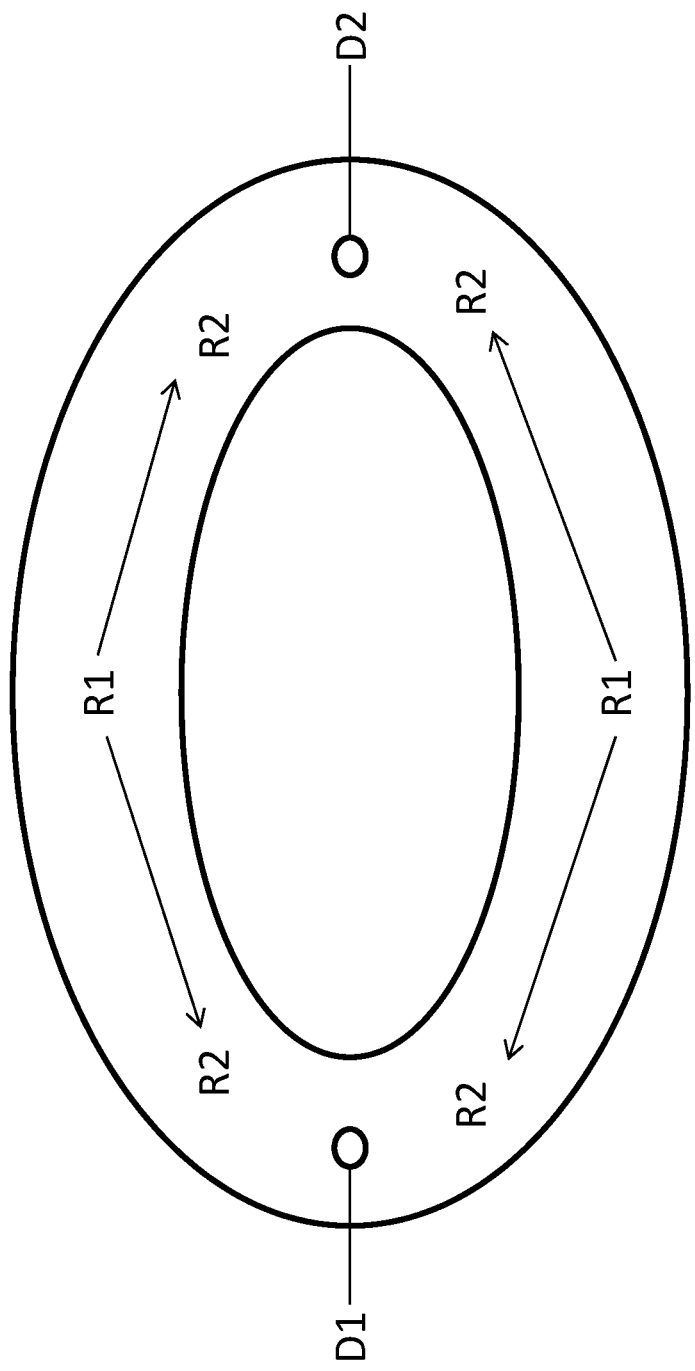
FIG. 20 is a top plan view of an exemplary collection tray showing a changing radius of curvature associated with the trough.

Now referring to FIGS. 14A-14B and 20, in which another aspect of the present invention is illustrated. FIG. 17 shows a general schematic (top view) of one collection tray (410, 420, 430, 440). The collection tray includes first and second drains D1, D2 that are spaced apart from one another (e.g., D1, D2 being 180 degrees apart). As mentioned above, the drains D1, D2 are in fluid communication with the trough formed in the collection tray to allow drainage of the collected fluid. As mentioned, the collection tray has an annular shape and there is a first annular region between the two drains D1, D2 and there is an opposite second annular region between the two drains D1, D2. Each of the first and second annular regions is constructed such it has a variable radius of curvature and in particular, an angle between the inner wall portion and the outer wall portion varies along the annular region in a direction toward one of the drains D1, D2. For example, a maximum radius (R1) can be located between the drains D1, D2 (e.g., equidistant from the drains D1, D2) and a reduced radius (R2) is located between the area of maximum radius (R1) and one drain D1, D2. By providing areas of reduced radius (R2) adjacent each drain D1, D2, fluid will natural flow from the area of maximum radius (R1) to the drains D1, D2 (due to the change in the slope of the collection tray—which funnels the fluid to the drains D1, D2). This construction thus ensures fluid flow within the trough of the collection chamber to the drains D1, D2.

It will also be understood that while FIG. 20 shows a pair of drains D1, D2, there can be a single drain D1 in which case the area of the collection tray directly opposite the single drain D1 represent high points of the trough section and the area close to the drain D1 represent low points so as to cause the fluid to flow in a direction toward and to the drain D1. There could also be more than two drains formed in the collection tray.

Figure 15:
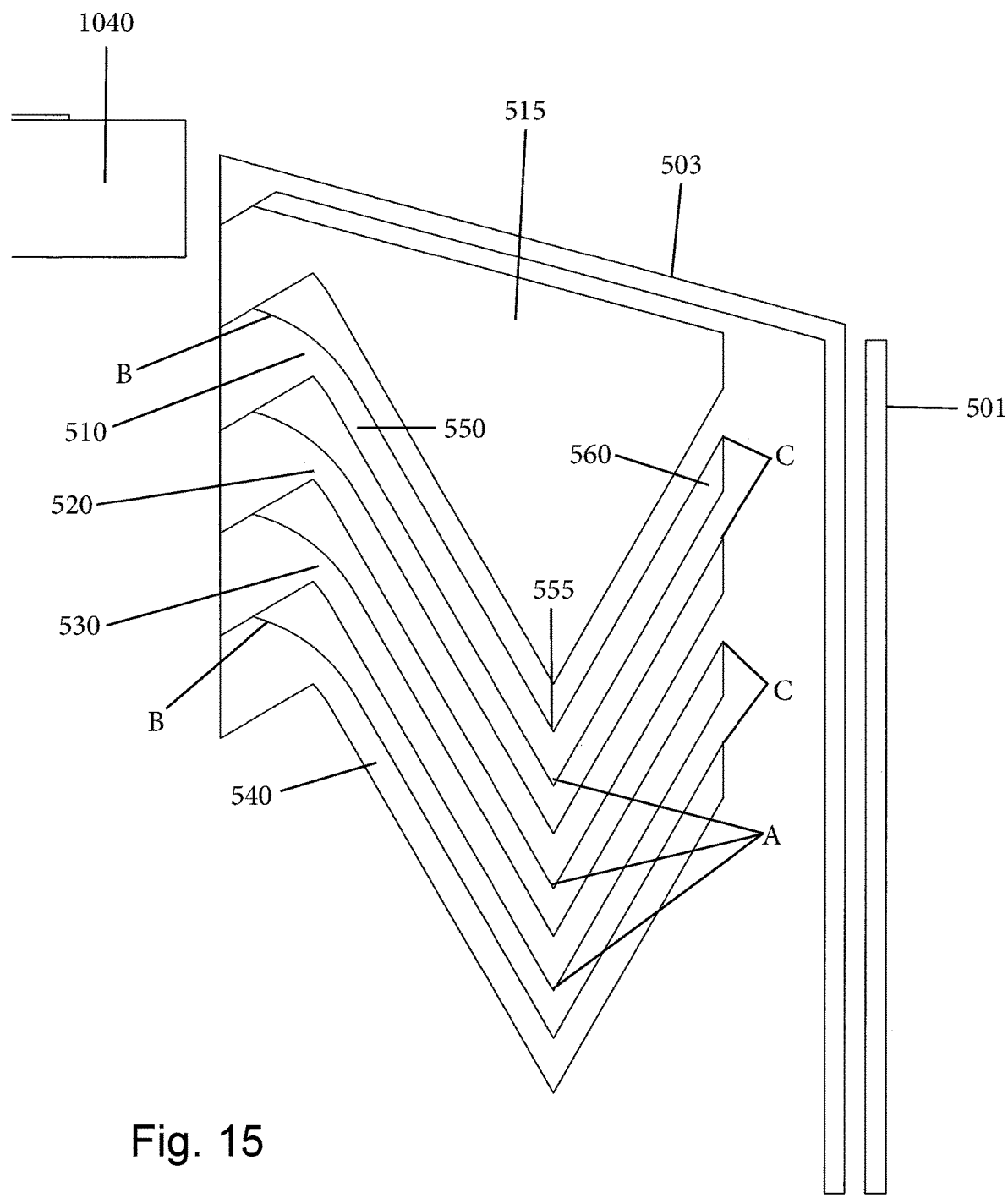
FIG. 15 is a cross-sectional view of a portion of a collection chamber apparatus defined by a plurality of collection trays in accordance with another embodiment of the present invention showing an upper cover and the collection tray in a closed position (lowered position)

FIG. 15 illustrates a localized portion of another collection chamber apparatus similar to the ones described previously and therefore, not all of the components are described and illustrated. As can be seen, an outer peripheral edge of the chuck 110 is visible. The collection chamber apparatus of this embodiment includes a collection tray arrangement or assembly 500 and an outer collection tray outer housing 501 in which the collection tray arrangement 500 is disposed. A movable splash shield 503 is provided within the outer housing 501 and is movable in a vertical direction from a raised position to a lowered position (which is shown in FIG. 15).

In the illustrated embodiment, which is exemplary in nature, there are four different collection trays, namely, a first collection tray 510, a second collection tray 520, a third collection tray 530, and a fourth collection tray 540 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 510, 520, 530, 540 can have the same or similar basic design as shown in the figures. In the illustrated embodiment, each of the collection trays 510, 520, 530, 540 is generally annular shaped with a center opening that receives the spin chuck 1040 and the wafer 115. Each collection tray has a main section that defines an annular shaped collection track which is defined by an inner wall portion 550 and an outer wall portion 560 that intersect one another to define a trough 555. As shown in FIG. 15, the main collection portion of the collection tray is generally V-shaped.

As annotated in the figures, a bottom of the trough 555 is defined by a point A and an inner top edge 551 of the inner wall portion 550 is defined by a point B and an outer top edge 561 of the outer wall portion 560 is defined by a point C. Point A thus represents the lowermost point of a given collection tray. The relationship between the points A, B, and C is an important aspect of this embodiment.

As shown in the figures, the first collection tray 510 also includes a cover portion 515 that covers the annular shaped recessed fluid collection track defined between the inner wall portion 550 and the outer wall portion 560. The cover portion 515 thus has a downwardly extending protrusion that is disposed within this annular shaped recessed fluid collection track of the first collection tray 510. The cover portion 515 thus effectively covers the trough 555 and prevents any fluid from flowing into the trough 555 of the first collection tray 510.

While not shown in the cross-sectional view of FIG. 15, each collection tray can have a pair of outwardly extending flange sections similar to the pair of outwardly extending flange sections 133 of the collection tray 130. The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

Each of the collection trays includes one or more outlet ports (drains) formed at a location thereof and in particular, the outlet port can be the same as or similar to the outlet port 136 of the collection tray 130. As such, the outlet port is in fluid communication with the trough 555. The outlet port can be in the form of a spout or the like that extends tangentially along the main section of the collection tray between the flange sections (See, FIG. 13). The outlet port can provide another trough along which the collected fluid flows. The bottom of the outlet port is in fluid communication with the bottom (floor) of the trough 555 and thus fluid can flow from the trough 555 into the outlet port. The outlet port of each collection tray can be in fluid communication with a manifold structure, such as the manifold structure 200 of FIGS. 1-10, to route the collected fluid away from the chuck.

In accordance with the present invention, the bottom of the trough 555 (point A) of the raised first collection tray 510 is positioned below point B (inner top edge of the inner wall portion 550) of the second collection tray 520 and point A is preferably at the same height or is below point C (outer top edge of the outer wall portion 560). Applicant discovered that the aforementioned relationship between points A, B, and C eliminates or greatly reduces any spray splashing outside of the first collection chamber 401. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 520 into contact with the raised first collection tray 510 while the third and fourth collection trays 530, 540 are in the lowered position defines a second collection chamber for collecting fluid that is discharged from the wafer (e.g., a different fluid (chemistry) than that used in the first collection chamber). Raising the third collection tray 530 into contact with the raised second collection tray 520 while the fourth collection tray 540 is in the lowered position defines a third collection chamber for collecting fluid that is discharged from the wafer (e.g., a different fluid (chemistry) than that used in the first and second collection chambers).

Collection trays 510, 520, 530, 540 can be individually and independently raised and lowered the collection trays 510, 520, 530, 540 using one of the mechanisms described herein.

Exhaust gas (air) can be pulled through the collections chambers and is directed downward along the splash shield 503 to an exhaust outlet/vent, such as the chemical exhaust 1070 (FIG. 11).

It will also be appreciated that each of the collection trays 510, 520, 530, 540 can have a construction as shown in FIG. 20 in that the radius varies along the circumference of the collection tray to generate flow to the drains D1, D2.

When the splash shield 503 is in the lowered position, exhaust gas can be vented through the chamber exhaust 1070 (FIG. 11).

Figure 16B:
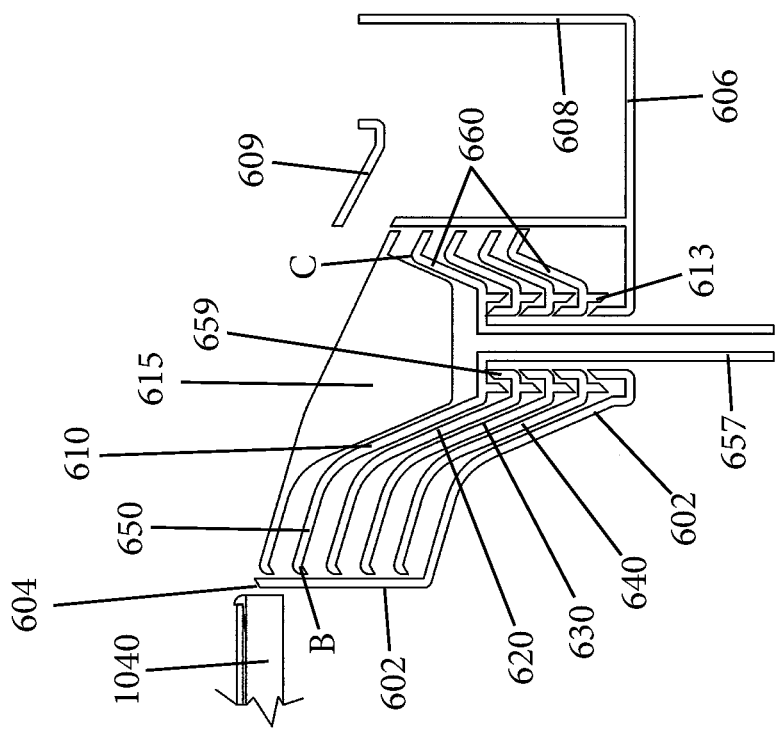
FIG. 16B is a cross-sectional view of the upper cover and collection trays of FIG. 16A in a closed position (lowered position)
Figure 16A:
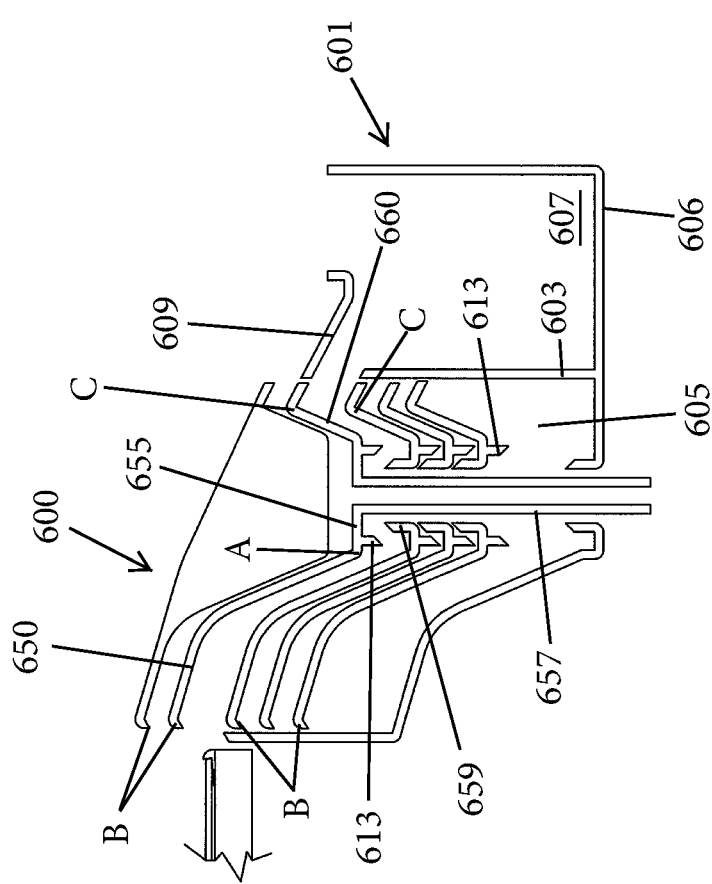
FIG. 16A is a cross-sectional view of a portion of a collection chamber apparatus defined by a plurality of collection trays in accordance with another embodiment of the present invention showing an upper cover and a first collection tray in a raised position (a first fluid collection position)

FIGS. 16A and 16B illustrate a localized portion of another collection chamber apparatus similar to the ones described previously and therefore, not all of the components are described and illustrated. As can be seen, an outer peripheral edge of the chuck 1040 is visible. The collection chamber apparatus of this embodiment includes a collection tray arrangement or assembly 600 and an outer collection tray outer housing 601 in which the collection tray arrangement 600 is disposed.

The collection tray outer housing 601 is a hollow part that circumferentially surrounds the chuck 1040 and wafer 115. As shown, the collection tray outer housing 601 can include an inner divider wall 603 that partitions the hollow interior space of the collection tray outer housing 601 into a first compartment 605 and a second compartment 607 that is located radially outward from the first compartment 605 (the first compartment 605 is thus located adjacent to an outer peripheral edge of the wafer 115, while the second compartment 607 is spaced radially therefrom. It will be appreciated that the collection tray outer housing 601 thus has an annular shape and both the first and second compartments 605, 607 have an annular shape.

The first compartment 605 is configured to hold the collection tray arrangement 600 in such a manner, as described below, that each collection tray can be moved (i.e., raised or lowered). While the first compartment 605 is shown as having a greater area compared to the second compartment 607, this is merely one exemplary embodiment and it will be understood that the shapes of the two compartments 605, 607 and the relative sizes thereto are not limited to what is shown in the figures. As shown, the first compartment 605 is defined by an inner wall 602 that is proximate the outer edge of the wafer 115 and terminates in a top edge 604. The first compartment 605 is also defined by the divider wall 603 which is parallel to the inner wall 602 and terminates in a top edge. The height of the divider wall 603 is less than the height of the inner wall 602 and thus, the top edge of the divider wall 603 lies below the top edge 604. A bottom wall 606 defines the bottom of the compartment and thus, acts as a floor.

The second compartment 607 is defined by an outer wall 608 and the divider wall 603 and the bottom of the second compartment 607 is defined by the bottom wall 606. The outer wall 608 is parallel to the divider wall 603. The second compartment 607 is also defined by a top wall portion 609 that has a first leg that extends toward the first compartment and a second leg that is between the outer wall and the divider wall 603 and is parallel thereto. The top wall portion 609 is configured and position so as to define a first opening or first passageway and a second opening or second passageway. The first passageway is defined between the first leg of the top wall portion 609 and the top edge of the divider wall 603 and as a result, defines a flow path from the first compartment into the second compartment. The second passageway is defined between the second leg of the top wall portion 609 and the outer wall 608 and defines an outlet or exit from the second compartment and preferably leads to the chemical exhaust 1080 (FIG. 11).

The bottom wall 606 includes a plurality of holes or openings to receive drainage tubes associated with the individual collection trays as described below. Each hole receives one drainage tube in a sealed manner, while permitting vertical movement of the drainage tube.

In the illustrated embodiment, which is exemplary in nature, there are four different collection trays, namely, a first collection tray 610, a second collection tray 620, a third collection tray 630, and a fourth collection tray 640 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 610, 620, 630, 640 can have the same or similar basic design as shown in the figures. In the illustrated embodiment, each of the collection trays 610, 620, 630, 640 is generally annular shaped with a center opening that receives the spin chuck 1040 and the wafer 115.

Each collection tray has a main section that defines an annular shaped collection track which is defined by an inner wall portion 650 and an outer wall portion 660 that intersect one another to define a trough 655. As shown in FIGS. 16A and 16B, the trough 655 has an opening that fluidly connects to a drainage conduit (tube) 657 that passes through hole.

Along an underside of each of the collection tray is a downwardly extending protrusion 613 that surrounds the hole. Each of the second, third and fourth collection trays 620, 630, 640 also includes an opening to receive and allow for passage of the drainage tube 657. Around the opening in the trough is an upstanding inner wall 659 which surrounds the opening and prevents fluid from flowing into the opening. As shown, the upstanding inner wall 659 is received between the downwardly extending protrusion 613 when the collection trays are nested with one another.

As annotated in the figures, a bottom of the trough 655 is defined by a point A and an inner top edge of the inner wall portion 650 is defined by a point B and an outer top edge of the outer wall portion 660 is defined by a point C. Point A thus represents the lowermost point of a given collection tray. The relationship between the points A, B, and C is an important aspect of this embodiment.

As shown in the figures, the first collection tray 610 also includes a cover portion 615 that covers the annular shaped recessed fluid collection track defined between the inner wall portion 650 and the outer wall portion 660. The cover portion 615 thus has a downwardly extending protrusion that is disposed within this annular shaped recessed fluid collection track of the first collection tray 610. The cover portion 615 thus effectively covers the trough 655 and prevents any fluid from flowing into the trough 655 of the first collection tray 610.

While not shown in the cross-sectional view of FIGS. 16A and 16B, each collection tray can have a pair of outwardly extending flange sections similar to the pair of outwardly extending flange sections 133 of the collection tray 130. The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

Each of the collection trays includes one or more outlet ports (drains) formed at a location thereof and in particular and in particular, each collection tray includes one or more drainage tubes 657 that drain fluid that collects in the trough of the collection tray. As shown, the underlying collections trays have openings formed in their trough sections to accommodate passage of the drainage tubes associated with overlying collection trays. The drainage tubes 657 are thus circumferentially spaced from one another and each collection tray can include two drainage tubes that can be disposed opposite one another.

FIG. 16A shows the first collection tray 610 and cover portion 615 in a raised position with a first collection chamber being defined between the raised first collection tray 610 and the lowered second collection tray 620. As with the previous embodiment, exhaust gas (air) can flow through the first collection chamber through the first passageway into the second compartment 607 and then exits through the second passageway.

FIG. 16B shows all of the collection trays and the cover portion 615 in the lowered position. Exhaust gas (air) can still flow over the cover portion 615 through the first passageway into the second compartment 607 and then exits through the second passageway. The exhaust gas thus flows around the drainage tube(s) 657 and can flow to the chemical exhaust 1080 (FIG. 11).

In accordance with the present invention, the bottom of the trough 655 (point A) of the raised first collection tray 610 is positioned below point B (inner top edge of the inner wall portion 650) of the second collection tray 620 and point A is preferably at the same height or is below point C (outer top edge of the outer wall portion 660). Applicant discovered that the aforementioned relationship between points A, B, and C eliminates or greatly reduces any spray splashing outside of the first collection chamber. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 620 into contact with the raised first collection tray 610 while the third and fourth collection trays 630, 640 are in the lowered position defines a second collection chamber for collecting fluid that is discharged from the wafer (e.g., a different fluid (chemistry) than that used in the first collection chamber). Raising the third collection tray 630 into contact with the raised second collection tray 620 while the fourth collection tray 640 is in the lowered position defines a third collection chamber for collecting fluid that is discharged from the wafer (e.g., a different fluid (chemistry) than that used in the first and second collection chambers).

Collection trays 610, 620, 630, 640 can be individually and independently raised and lowered the collection trays 610, 620, 630, 640 using one of the mechanisms described herein.

It will also be appreciated that each of the collection trays 610, 620, 630, 640 can have a construction as shown in FIG. 20 in that the radius varies along the circumference of the collection tray to generate flow to the drains D1, D2.

Figure 17B:
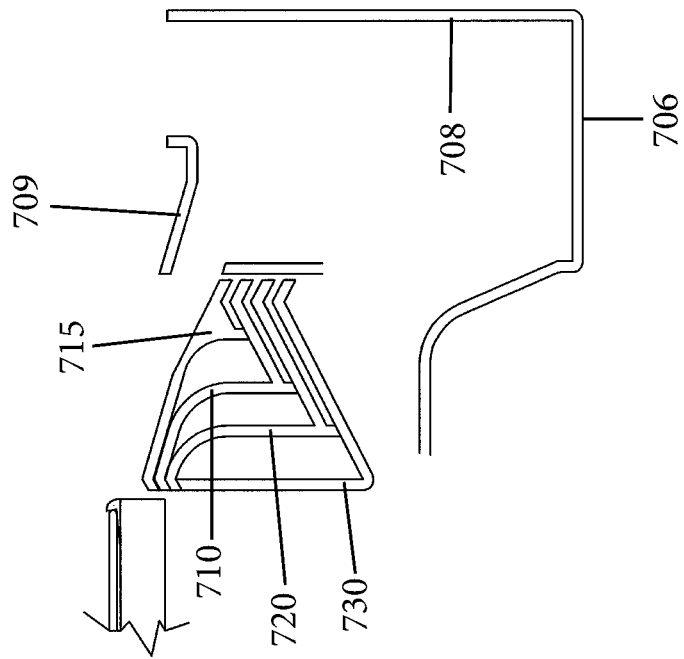
FIG. 17B is a cross-sectional view of the upper cover and collection trays of FIG. 17A in a closed position (lowered position)
Figure 17A:
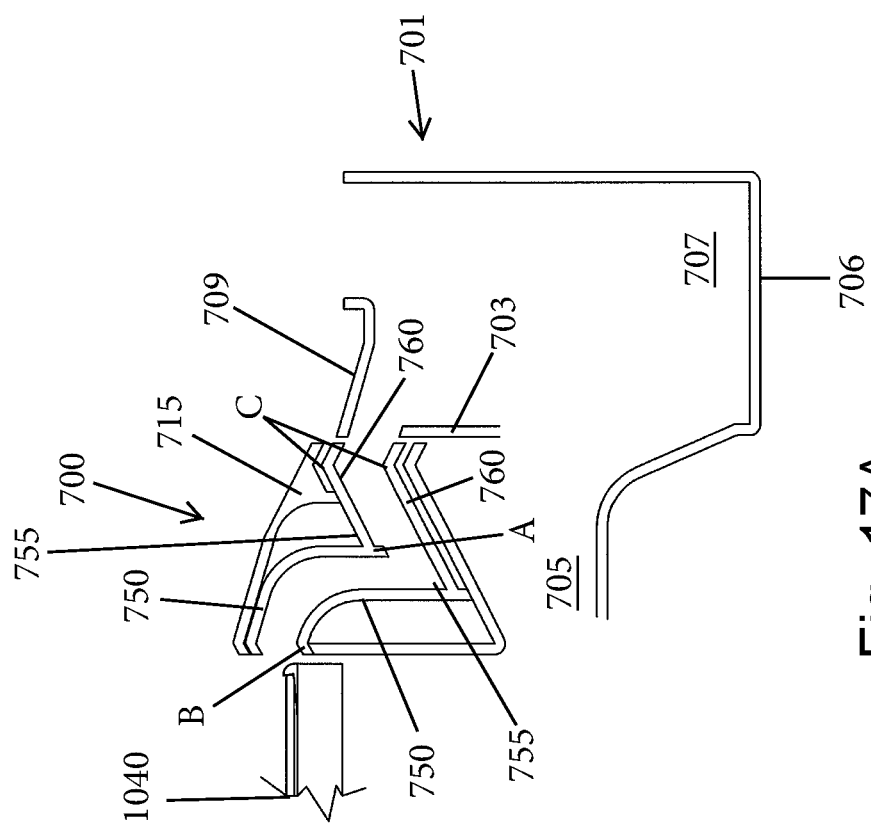
FIG. 17A is a cross-sectional view of a portion of a collection chamber apparatus defined by a plurality of collection trays in accordance with another embodiment of the present invention showing an upper cover and a first collection tray in a raised position (a first fluid collection position)

FIGS. 17A and 17B illustrate a localized portion of another collection chamber apparatus similar to the ones described previously and therefore, not all of the components are described and illustrated. As can be seen, an outer peripheral edge of the chuck 1040 is visible. The collection chamber apparatus of this embodiment includes a collection tray arrangement or assembly 700 and an outer collection tray outer housing 701 in which the collection tray arrangement 700 is disposed.

The collection tray outer housing 701 is a hollow part that circumferentially surrounds the chuck 110 and wafer 115. As shown, the collection tray outer housing 701 can include an inner divider wall 703 that partitions the hollow interior space of the collection tray outer housing 701 into a first compartment 705 and a second compartment 707 that is located radially outward from the first compartment 705 (the first compartment 705 is thus located adjacent to an outer peripheral edge of the chuck 110 and the wafer 115, while the second compartment 707 is spaced radially therefrom. It will be appreciated that the collection tray outer housing 701 thus has an annular shape and both the first and second compartments 705, 707 have an annular shape.

The first compartment 705 is configured to hold the collection tray arrangement 700 in such a manner, as described below, that each collection tray can be moved (i.e., raised or lowered). While the first compartment 705 is shown as having a greater area compared to the second compartment 707, this is merely one exemplary embodiment and it will be understood that the shapes of the two compartments 705, 707 and the relative sizes thereto are not limited to what is shown in the figures. The second compartment 707 is defined by an outer wall 708 and the divider wall 703 and the bottom of the second compartment 707 is defined by the bottom wall 706. The outer wall 708 is parallel to the divider wall 703. The second compartment 707 is also defined by a top wall portion 709 that has a first leg that extends toward the first compartment and a second leg that is between the outer wall and the divider wall 703 and is parallel thereto. The top wall portion 709 is configured and position so as to define a first opening or first passageway and a second opening or second passageway. The first passageway is defined between the first leg of the top wall portion 709 and the top edge of the divider wall 703 and as a result, defines a flow path from the first compartment into the second compartment. The second passageway is defined between the second leg of the top wall portion 709 and the outer wall 708 and defines an outlet or exit from the second compartment.

In the illustrated embodiment, which is exemplary in nature, there are three different collection trays, namely, a first collection tray 710, a second collection tray 720, and a third collection tray 730 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 710, 720, 730 can have the same or similar basic design as shown in the figures. In the illustrated embodiment, each of the collection trays 710, 720, 730 is generally annular shaped with a center opening that receives the spin chuck 1040 and the wafer 115. Each collection tray has a main section that defines an annular shaped collection track which is defined by an inner wall portion 750 and an outer wall portion 760 that intersect one another to define a trough 755. As shown in FIGS. 17A and 17B, the trough 755 has one or more drainage outlets that fluidly connect to a drain.

As annotated in the figures, a bottom of the trough 755 is defined by a point A and an inner top edge of the inner wall portion 750 is defined by a point B and an outer top edge of the outer wall portion 760 is defined by a point C. Point A thus represents the lowermost point of a given collection tray. The relationship between the points A, B, and C is an important aspect of this embodiment.

As shown in the figures, the first collection tray 710 also includes a cover portion 715 that covers the annular shaped recessed fluid collection track defined between the inner wall portion 750 and the outer wall portion 760. The cover portion 715 thus has a downwardly extending protrusion that is disposed within this annular shaped recessed fluid collection track of the first collection tray 710. The cover portion 715 thus effectively covers the trough 755 and prevents any fluid from flowing into the trough 755 of the first collection tray 710.

While not shown in the cross-sectional view of FIGS. 17A and 17B, each collection tray can have a pair of outwardly extending flange sections similar to the pair of outwardly extending flange sections 133 of the collection tray 130. The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

FIG. 17A shows the first collection tray 710 and cover portion 715 in a raised position with a first collection chamber being defined between the raised first collection tray 710 and the lowered second collection tray 720. As with the previous embodiment, exhaust gas (air) can flow through the first collection chamber through the first passageway into the second compartment 707 and then exits through the second passageway to the chemical exhaust 1080 (FIG. 11).

FIG. 17B shows all of the collection trays and the cover portion 715 in the lowered position. Exhaust gas (air) can still flow over the cover portion 715 through the first passageway into the second compartment 707 and then exits through the second passageway.

In accordance with the present invention, the bottom of the trough 755 (point A) of the raised first collection tray 710 is positioned below point B (inner top edge 751 of the inner wall portion 750) of the second collection tray 720 and point A is preferably at the same height or is below point C (outer top edge 761 of the outer wall portion 760). Applicant discovered that the aforementioned relationship between points A, B, and C eliminates or greatly reduces any spray splashing outside of the first collection chamber. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 720 into contact with the raised first collection tray 710 while the third collection tray 730, is in the lowered position defines a second collection chamber for collecting fluid that is discharged from the wafer (e.g., a different fluid (chemistry) than that used in the first collection chamber).

Collection trays 710, 720, 730 can be individually and independently raised and lowered the collection trays 710, 720, 730 using one of the mechanisms described herein.

It will also be appreciated that each of the collection trays 710, 720, 730 can have a construction as shown in FIG. 20 in that the radius varies along the circumference of the collection tray to generate flow to the drains D1, D2.

FIGS. 18A and 18B illustrate a localized portion of another collection chamber apparatus similar to the ones described previously and therefore, not all of the components are described and illustrated. As can be seen, an outer peripheral edge of the chuck 1040 is visible. The collection chamber apparatus of this embodiment includes a collection tray arrangement or assembly 800 and an outer collection tray outer housing 801 in which the collection tray arrangement 800 is disposed.

The collection tray outer housing 801 is a hollow part that circumferentially surrounds the chuck 1040 and wafer 115. As shown, the collection tray outer housing 801 can include an inner divider wall 803 that partitions the hollow interior space of the collection tray outer housing 801 into a first compartment 805 and a second compartment 807 that is located radially outward from the first compartment 805 (the first compartment 805 is thus located adjacent to an outer peripheral edge of the chuck 1040 and the wafer 115, while the second compartment 807 is spaced radially therefrom. It will be appreciated that the collection tray outer housing 801 thus has an annular shape and both the first and second compartments 805, 807 have an annular shape.

The first compartment 805 is configured to hold the collection tray arrangement 800 in such a manner, as described below, that each collection tray can be moved (i.e., raised or lowered). While the first compartment 805 is shown as having a greater area compared to the second compartment 807, this is merely one exemplary embodiment and it will be understood that the shapes of the two compartments 805, 807 and the relative sizes thereto are not limited to what is shown in the figures. The second compartment 807 is defined by an outer wall 808 and the divider wall 803 and the bottom of the second compartment 807 is defined by the bottom wall 806. The outer wall 808 is parallel to the divider wall 803. The second compartment 807 is also defined by a top wall portion 809 that has a first leg that extends toward the first compartment and a second leg that is between the outer wall and the divider wall 803 and is parallel thereto. The top wall portion 809 is configured and position so as to define a first opening or first passageway and a second opening or second passageway. The first passageway is defined between the first leg of the top wall portion 809 and the top edge of the divider wall 803 and as a result, defines a flow path from the first compartment into the second compartment. The second passageway is defined between the second leg of the top wall portion 809 and the outer wall 808 and defines an outlet or exit from the second compartment.

In the illustrated embodiment, which is exemplary in nature, there are four different collection trays, namely, a first collection tray 810, a second collection tray 820, a third collection tray 830, and a fourth collection tray 840 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 810, 820, 830, 840 can have the same or similar basic design as shown in the figures. In the illustrated embodiment, each of the collection trays 810, 820, 830, 840 is generally annular shaped with a center opening that receives the spin chuck 1040 and the wafer 115. Each collection tray has a main section that defines an annular shaped collection track which is defined by an inner wall portion 850 and an outer wall portion 860 that intersect one another to define a trough 855. As shown in FIGS. 18A and 18B, the trough 855 has one or more drainage outlets that fluidly connect to a drain.

As annotated in the figures, a bottom of the trough 855 is defined by a point A and an inner top edge of the inner wall portion 850 is defined by a point B and an outer top edge of the outer wall portion 860 is defined by a point C. Point A thus represents the lowermost point of a given collection tray. The relationship between the points A, B, and C is an important aspect of this embodiment.

As shown in the figures, the first collection tray 810 also includes a cover portion 815 that covers the annular shaped recessed fluid collection track defined between the inner wall portion 850 and the outer wall portion 860. The cover portion 815 thus has a downwardly extending protrusion that is disposed within this annular shaped recessed fluid collection track of the first collection tray 810. The cover portion 815 thus effectively covers the trough 855 and prevents any fluid from flowing into the trough 855 of the first collection tray 810.

While not shown in the cross-sectional view of FIGS. 18A and 18B, each collection tray can have a pair of outwardly extending flange sections similar to the pair of outwardly extending flange sections 133 of the collection tray 130. The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

FIG. 18A shows the first collection tray 810 and cover portion 815 in a raised position with a first collection chamber being defined between the raised first collection tray 810/cover portion 815 and the lowered collection trays 820, 830, 840. As with the previous embodiment, exhaust gas (air) can flow through the first collection chamber through the first passageway into the second compartment 807 and then exits through the second passageway.

FIG. 18B shows all of the collection trays and the cover portion 815 in the lowered position. Exhaust gas (air) can still flow over the cover portion 815 through the first passageway into the second compartment 807 and then exits through the second passageway to the chemical exhaust 1080 (FIG. 11).

In accordance with the present invention, the bottom of the trough 855 (point A) of the raised first collection tray 810 is positioned below point B (inner top edge 851 of the inner wall portion 850) of the second collection tray 820 and point A is preferably at the same height or is below point C (outer top edge 861 of the outer wall portion 860). Applicant discovered that the aforementioned relationship between points A, B, and C eliminates or greatly reduces any spray splashing outside of the first collection chamber. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 820 into contact with the raised first collection tray 810 while the collection trays 830, 840 is in the lowered position defines a second collection chamber for collecting fluid that is discharged from the wafer (e.g., a different fluid (chemistry) than that used in the first collection chamber). A third collection chamber can be defined between raised trays 810, 820, 830 and the lowered fourth collection tray 840.

Collection trays 810, 820, 830, 840 can be individually and independently raised and lowered the collection trays 810, 820, 830, 840 using one of the mechanisms described herein.

It will also be appreciated that each of the collection trays 810, 820, 830, 840 can have a construction as shown in FIG. 20 in that the radius varies along the circumference of the collection tray to generate flow to the drains D1, D2.

FIGS. 19A and 19B illustrate a localized portion of another collection chamber apparatus similar to the ones described previously and therefore, not all of the components are described and illustrated. As can be seen, an outer peripheral edge of the chuck 1040 is visible. The collection chamber apparatus of this embodiment includes a collection tray arrangement or assembly 900 and an outer collection tray outer housing 901 in which the collection tray arrangement 900 is disposed.

The collection tray outer housing 901 is a hollow part that circumferentially surrounds the chuck 110 and wafer 115. As shown, the collection tray outer housing 901 can include an inner divider wall 903 that partitions the hollow interior space of the collection tray outer housing 901 into a first compartment 905 and a second compartment 907 that is located radially outward from the first compartment 905 (the first compartment 905 is thus located adjacent to an outer peripheral edge of the chuck 110 and the wafer 115, while the second compartment 907 is spaced radially therefrom. It will be appreciated that the collection tray outer housing 901 thus has an annular shape and both the first and second compartments 905, 907 have an annular shape.

The first compartment 905 is configured to hold the collection tray arrangement 900 in such a manner, as described below, that each collection tray can be moved (i.e., raised or lowered). While the first compartment 905 is shown as having a greater area compared to the second compartment 907, this is merely one exemplary embodiment and it will be understood that the shapes of the two compartments 905, 907 and the relative sizes thereto are not limited to what is shown in the figures. The second compartment 907 is defined by an outer wall 908 and the divider wall 903 and the bottom of the second compartment 907 is defined by the bottom wall 906. The outer wall 908 is parallel to the divider wall 903. The second compartment 907 is also defined by a top wall portion 909 that has a first leg that extends toward the first compartment and a second leg that is between the outer wall and the divider wall 903 and is parallel thereto. The top wall portion 909 is configured and position so as to define a first opening or first passageway and a second opening or second passageway. The first passageway is defined between the first leg of the top wall portion 909 and the top edge of the divider wall 903 and as a result, defines a flow path from the first compartment into the second compartment. The second passageway is defined between the second leg of the top wall portion 909 and the outer wall 908 and defines an outlet or exit from the second compartment.

In the illustrated embodiment, which is exemplary in nature, there are four different collection trays, namely, a first collection tray 910, a second collection tray 920, a third collection tray 930, and a fourth collection tray 940 that are arranged in a stacked configuration. However, it will be understood that less than or more than four collection trays can be used in the apparatus. It will be appreciated that the addition of one collection tray results in a corresponding addition of a distinct collection chamber for collecting a fluid. This aspect will be readily understood from the below discussion and from the drawing figures.

The collection trays 910, 920, 930, 940 can have the same or similar basic design as shown in the figures. In the illustrated embodiment, each of the collection trays 910, 920, 930, 940 is generally annular shaped with a center opening that receives the spin chuck 1040 and the wafer 115. Each collection tray has a main section that defines an annular shaped collection track which is defined by an inner wall portion 950 and an outer wall portion 960 that intersect one another to define a trough 955. The trough 955 has one or more drainage outlets that fluidly connect to a drain and permit collected fluid to be routed away from the collection trays.

As annotated in the figures, a bottom of the trough 955 is defined by a point A and an inner top edge of the inner wall portion 950 is defined by a point B and an outer top edge of the outer wall portion 960 is defined by a point C. Point A thus represents the lowermost point of a given collection tray. The relationship between the points A, B, and C is an important aspect of this embodiment.

As shown in the figures, the first collection tray 910 also includes a cover portion 915 that covers the annular shaped recessed fluid collection track defined between the inner wall portion 950 and the outer wall portion 960. The cover portion 915 thus has a downwardly extending protrusion that is disposed within this annular shaped recessed fluid collection track of the first collection tray 910. The cover portion 915 thus effectively covers the trough 955 and prevents any fluid from flowing into the trough 955 of the first collection tray 910.

While not shown in the cross-sectional view of FIGS. 19A and 19B, each collection tray can have a pair of outwardly extending flange sections similar to the pair of outwardly extending flange sections 133 of the collection tray 130. The flange sections are preferably located opposite one another (e.g., 180 degrees apart) and have a plurality of openings (such as openings 134) formed therein. The openings are spaced along the flange section between the side walls thereof. In one illustrated embodiment, there are three openings that receive working pistons (e.g., ends of pneumatic (air) cylinders) as described with reference to the embodiment of FIGS. 1-10. There is also an additional opening formed in each flange section. The arrangement of these openings can be the same or similar to the arrangement of the openings 134, 135 of FIGS. 1-10.

FIG. 19A shows the first collection tray 910 and cover portion 915 in a raised position with a first collection chamber being defined between the raised first collection tray 910/cover portion 915 and the lowered collection trays 920, 930, 940. As with the previous embodiment, exhaust gas (air) can flow through the first collection chamber through the first passageway into the second compartment 907 and then exits through the second passageway to the chemical exhaust 1080 (FIG. 11).

FIG. 19B shows all of the collection trays and the cover portion 915 in the lowered position. Exhaust gas (air) can still flow over the cover portion 915 through the first passageway into the second compartment 807 and then exits through the second passageway to the chemical exhaust 1080 (FIG. 11).

In accordance with the present invention, the bottom of the trough 955 (point A) of the raised first collection tray 910 is positioned below point B (inner top edge of the inner wall portion 950) of the second collection tray 920 and point A is preferably at the same height or is below point C (outer top edge of the outer wall portion 960). Applicant discovered that the aforementioned relationship between points A, B, and C eliminates or greatly reduces any spray splashing outside of the first collection chamber. This arrangement holds true for the other positions of the collection trays in that point A for a raised collection tray is lower than point B for a lowered collection tray that is immediately below and point A of the raised collection tray has a height equal to or less than point C.

As with the previous embodiment of FIGS. 1-10, raising the second collection tray 920 into contact with the raised first collection tray 910 while the collection trays 930, 940 are in the lowered position defines a second collection chamber for collecting fluid that is discharged from the wafer (e.g., a different fluid (chemistry) than that used in the first collection chamber). A third collection chamber can be defined between raised trays 910, 920, 930 and the lowered fourth collection tray 940.

Collection trays 910, 920, 930, 940 can be individually and independently raised and lowered using one of the mechanisms described herein.

It will also be appreciated that each of the collection trays 910, 920, 930, 940 can have a construction as shown in FIG. 20 in that the radius varies along the circumference of the collection tray to generate flow to the drains D1, D2.

FIGS. 14A to 19B thus illustrate various constructions for movable collection trays that include drainage features (openings or drainage tubes) for draining collected fluid and also have a relationship between points A, B, C, as expressed herein, to prevent fluid from splashing out of the collection chamber defined between a raised collection tray and another collection tray that is immediately below. In effect, by creating the innermost edge (point B) of the lowered collection tray to be lower than the bottommost point A (at the trough area) of the raised collection tray, fluid that enters the collection chamber in a lateral direction strikes the downwardly extending trough portion of the raised collection tray and this blocks the collected fluid from exiting the collection tray along an outer edge thereof. The downwardly extending trough (point A) of the raised collection tray acts as a deflector or blocker for fluid entering the collection chamber and defines a torturous flow path in that the fluid entering the collection chamber cannot flow directly across from the entrance to the exit. As with the previous embodiments, multiple collection chambers having similar or the same construction are provided to collect different fluids (different chemistries) that are used during the processing of the wafer. The raising and lowering of the collection trays to define the various collection chambers is performed in a controlled manner such as the methods described with respect to the embodiment of FIGS. 1-10. In particular, two pneumatic pistons can be provided to raise and lower each collection tray and the lower collections trays includes openings (such as in flange areas) that permit passage of the pneumatic pistons that are acting upon collection trays that are located above.

In all of the embodiments, when the collections trays are in the lowered position, the top edges of the collection trays are below the chuck 110. Conversely, when the collection tray is in a raised position, the top edge of the collection tray lies above the chuck 110. In addition, the exhaust passageway is provided and remains open when a collection chamber is formed.

Now referring to FIGS. 14A-12B and 20 in which another aspect of the present invention is illustrated. FIG. 20 shows a general schematic (top view) of the collection tray (410, 420, 430, 440). The collection tray includes first and second drains D1, D2 that are spaced apart from one another (e.g., D1, D2 being 180 degrees apart). As mentioned above, the drains D1, D2 are in fluid communication with the trough formed in the collection tray to allow drainage of the collected fluid. As mentioned, the collection tray has an annular shape and there is a first annular region between the two drains D1, D2 and there is an opposite second annular region between the two drains D1, D2. Each of the first and second annular regions is constructed such it has a variable radius of curvature and in particular, an angle between the inner wall portion 443 and the outer wall portion 444 varies along the annular region in a direction toward one of the drains D1, D2. For example, a maximum radius (R1) can be located between the drains D1, D2 (e.g., equidistant from the drains D1, D2) and a reduced radius (R2) is located between the area of maximum radius (R1) and one drain D1, D2. FIG. 18A shows the collection tray in R1 region (greater angle between the walls), while FIG. 18B shows the collection tray in R2 region (smaller angle between the walls). By providing areas of reduced radius (R2) adjacent each drain D1, D2, fluid will natural flow from the area of maximum radius (R1) to the drains D1, D2 (due to the change in the slope of the collection tray—which funnels the fluid to the drains D1, D2). This construction thus ensures fluid flow within the trough of the collection chamber to the drains D1, D2.

One exemplary area of maximum radius (R1) is defined by inner wall portion of the trough being formed at an angle of about 70° and the outer wall portion of the trough being formed at an angle of about 60°. One exemplary area of reduced radius (R2) is defined by the inner wall portion of trough being formed at an angle of about 75° and the outer wall portion of the trough being formed at an angle of about 70°.

While the invention has been described in connection with certain embodiments thereof, the invention is capable of being practiced in other forms and using other materials and structures. Accordingly, the invention is defined by the recitations in the claims appended hereto and equivalents thereof.

What is claimed is:

1. A wafer processing system comprising:
   a chamber housing;
   a rotatable wafer support member for supporting a wafer;
   a plurality of independently movable collection trays disposed about the peripheral edge of the wafer support member, the collection trays being arranged in a stacked configuration, each collection tray having a collection section for collecting fluid, wherein at least one of the collection trays has a drain outlet in communication with the collection section for draining collected fluid; and
   a drive mechanism for selectively and independently moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;
   a chamber exhaust outlet that is formed in the housing for venting gas from the interior of the housing outside of the collection trays, wherein the chamber exhaust outlet is disposed radially outward from the plurality of collection trays; and
   a chemical exhaust outlet that is formed in the housing for venting gas that flows through the collection chamber to the chemical exhaust outlet;
   wherein the chemical exhaust outlet is fluidly isolated from the chamber exhaust outlet and the plurality of collection trays defines a plurality of chemical exhaust flow paths that are all in fluid communication with the chemical exhaust outlet.

2. A wafer processing system comprising:
   a chamber housing;
   a rotatable wafer support member for supporting a wafer;
   a plurality of independently movable collection trays disposed about the peripheral edge of the wafer support member, the collection trays being arranged in a stacked configuration, each collection tray having a collection section for collecting fluid, wherein at least one of the collection trays has a drain outlet in communication with the collection section for draining collected fluid; and
   a drive mechanism for selectively and independently moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;
   a chamber exhaust outlet that is formed in the housing for venting gas from the interior of the housing outside of the collection trays;
   a chemical exhaust outlet that is formed in the housing for venting gas that flows through the collection chamber to the chemical exhaust outlet, wherein the chemical exhaust outlet is fluidly isolated from the chamber exhaust outlet; and
   a splash shield disposed about a peripheral edge of the wafer support member and being movable between a raised position and a lowered position;
   wherein the chemical exhaust outlet also vents gas that flows along a flow path defined between the splash shield in the raised position and the collection trays in the lowered position; and
   wherein the splash shield separates the chamber exhaust outlet from the chemical exhaust outlet.

3. The wafer processing system of claim 1, wherein the drive mechanism comprises at least a first pair of pistons disposed below the collection trays, each piston being movable between a retracted position in which all of the collection trays are in intimate contact with one another and an extended position in which at least one collection tray is moved to the elevated position and the collection chamber is formed therebetween.

4. The wafer processing system of claim 3, wherein the collection chamber is defined between an underside of the raised collection tray and an upper surface of the lowered collection tray that is disposed immediately below of the raised collection tray.

5. The wafer processing system of claim 1, wherein the plurality of collection trays comprises at least three collection trays that define at least two different collection chambers that are separate from one another.

6. The wafer processing system of claim 1, wherein the plurality of collection trays comprises at least four collection trays that define at least three different collection chambers that are separate from one another.

7. The wafer processing system of claim 1, wherein each collection tray has a V-shape.

8. The wafer processing system of claim 1, wherein each collection tray has an inner wall portion and an outer wall portion that converge to define a trough section for collecting fluid, the inner wall portion being closer to the wafer support member than the outer wall portion, the collection tray having an outlet in fluid communication with the trough section for discharging the collected fluid, wherein a bottom edge (A) of the trough section defines a bottommost point of the collection tray, the inner wall portion has a top edge (B) and the outer wall portion has a top edge (C);
   wherein the bottom edge (A) of the raised collection tray lies below the top edge (B) of the inner wall portion of the lowered collection tray and the bottom edge (A) of the raised collection tray is at a height that is equal to or below the top edge (C) of the outer wall portion.

9. The wafer processing system of claim 8, wherein a width of the inner wall portion is greater than a width of the outer wall portion.

10. The wafer processing system of claim 1, further including a collection tray housing that surrounds the wafer support member and in which the plurality of collection trays are disposed, the collection tray housing defining an exhaust outlet that is in fluid communication with the chemical exhaust to permit gas to be drawn through the collection chamber to the chemical exhaust.

11. A wafer processing system comprising:
a chamber housing;
a rotatable wafer support member for supporting a wafer;
a plurality of independently movable collection trays disposed about the peripheral edge of the wafer support member, the collection trays being arranged in a stacked configuration, each collection tray having a collection section for collecting fluid, wherein at least one of the collection trays has a drain outlet in communication with the collection section for draining collected fluid; and
a drive mechanism for selectively and independently moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;
a chamber exhaust outlet that is formed in the housing for venting gas from the interior of the housing outside of the collection trays;
a chemical exhaust outlet that is formed in the housing for venting gas that flows through the collection chamber to the chemical exhaust outlet, wherein the chemical exhaust outlet is fluidly isolated from the chamber exhaust outlet; and
a collection tray housing that surrounds the wafer support member and in which the plurality of collection trays are disposed, the collection tray housing defining an exhaust outlet that is in fluid communication with the chemical exhaust to permit gas to be drawn through the collection chamber to the chemical exhaust;
wherein the collection tray housing includes an inner divider wall that partitions the collection tray housing into a first compartment in which the plurality of collection trays are disposed and a second compartment that is located radially outward from the first compartment and includes the exhaust outlet of the collection tray housing.

12. The wafer processing system of claim 11, wherein a first passageway is defined by the inner divider wall to permit gas to flow from the first compartment to the second compartment due to the collection chamber being open to the first passageway and the second compartment includes a second passageway that leads to the exhaust outlet of the collection tray housing.

13. The wafer processing system of 12, wherein when the plurality of collection trays are all in lowered positions, the gas flows across an uppermost collection tray through the first passageway into the second compartment where it flows along the second passageway to the exhaust outlet of the collection tray housing.

14. A wafer processing system comprising:
a chamber housing;
a rotatable wafer support member for supporting a wafer;
a plurality of independently movable collection trays disposed about the peripheral edge of the wafer support member, the collection trays being arranged in a stacked configuration, each collection tray having a collection section for collecting fluid, wherein at least one of the collection trays has a drain outlet in communication with the collection section for draining collected fluid; and
a drive mechanism for selectively and independently moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;
a chamber exhaust outlet that is formed in the housing for venting gas from the interior of the housing outside of the collection trays; and
a chemical exhaust outlet that is formed in the housing for venting gas that flows through the collection chamber to the chemical exhaust outlet, wherein the chemical exhaust outlet is fluidly isolated from the chamber exhaust outlet;
wherein each collection tray is annular shaped and includes a first outlet (D1) and a second outlet (D2) spaced from the first outlet (D1), wherein a first arcuate portion (AR1) of the collection tray is defined between the first outlet (D1) and the second outlet (D2) on one side and a second arcuate portion (AR2) of the collection tray is defined between the first outlet (D1) and the second outlet (D2) on the other side, wherein a radius of curvature of the trough section within each of the first and second arcuate portions (AR1, AR2) varies along a length thereof.

15. The wafer processing system of claim 14, wherein a central portion of each of the first and second arcuate portions (AR1, AR2) has a greater degree of curvature than areas proximate each of the first outlet (D1) and the second outlet (D2) to promote fluid to flow in a direction toward one of the first outlet (D1) and the second outlet (D2).

16. The wafer processing system of claim 1, wherein the collection section comprises a trough section is defined by a planar floor and the outlet comprises a hole in the planar floor that leads to a drainage tube that is integrally formed with the trough section and depends downwardly therefrom.

17. The wafer processing system of claim 16, wherein each collection tray that is below an uppermost collection tray includes one or more openings formed in the trough section to permit passage of the drainage tube associated with one or more overlying collection trays.

18. The wafer processing system of claim 16, wherein each collection tray includes a first protrusion that extends outwardly from an underside of the trough section and surrounds the hole and each collection tray that is below an uppermost collection tray includes a second protrusion that extends outwardly from a top surface of the trough section and surrounds and defines the hole, wherein in the lowered position, the second protrusion is received between the first protrusion of an overlying collection tray.

19. The wafer processing system of claim 8, wherein plurality of collection trays comprises a first collection tray and a second collection tray that lies below the first collection tray, the trough section of the first collection tray being laterally offset and radially outward from the trough section of the second collection tray.

20. The wafer processing system of claim 19, wherein the bottom edge (A) of the first collection tray is disposed above the outer wall portion of the second collection tray and seats thereagainst when the first and second collections trays are in the lowered positions.

21. The wafer processing system of claim 20, wherein a top edge portion of the inner wall portion that terminates in the top edge (B) is curved and a top edge portion of the outer wall portion that terminates in the top edge (C) is beveled.

22. The wafer processing system of claim 1, wherein the drive mechanism comprises one of: (a) a plurality of stepper motors and (b) a plurality of pneumatic pistons.

23. The wafer processing system of claim 1, wherein the inner wall portion comprises a first angled wall and the outer wall portion comprises a second angled wall, the first and second angled walls intersecting at a point at which the trough section is formed.

\* \* \* \* \*